(12) United States Patent
Wang et al.

(10) Patent No.: US 10,616,460 B2
(45) Date of Patent: *Apr. 7, 2020

(54) DISPLAY WITH INTERSPACED MICROLENSES AND CORRESPONDING DEVICES AND METHODS

(71) Applicant: Motorola Mobility LLC, Chicago, IL (US)

(72) Inventors: Yuxin Wang, Palatine, IL (US); Alberto R Cavallaro, Northbrook, IL (US)

(73) Assignee: Motorola Mobility LLC, Chicago, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/363,942

(22) Filed: Mar. 25, 2019

(65) Prior Publication Data

US 2019/0222732 A1    Jul. 18, 2019

Related U.S. Application Data

(63) Continuation of application No. 15/719,072, filed on Sep. 28, 2017, now Pat. No. 10,284,759.

(51) Int. Cl.
*H04N 5/225* (2006.01)
*G02B 13/00* (2006.01)
(Continued)

(52) U.S. Cl.
CPC ......... *H04N 5/2257* (2013.01); *G02B 3/0056* (2013.01); *G02B 13/0085* (2013.01); *G06F 3/041* (2013.01); *G09G 3/00* (2013.01); *H01L 27/3234* (2013.01); *H01L 51/5275* (2013.01); *H04N 5/2253* (2013.01); *H04N 5/2254* (2013.01); *H04N 5/23232* (2013.01); *H04N 5/23245* (2013.01); *H04N 5/23293* (2013.01); *H04N 5/3454* (2013.01); *H04N 9/045* (2013.01); *H04N 13/229* (2018.05); *G02B 1/11* (2013.01); *H01L 27/14605* (2013.01); *H01L 27/14621* (2013.01); *H01L 27/14627* (2013.01); *H04N 5/22541* (2018.08)

(58) Field of Classification Search
CPC ..... H04N 19/31; H04N 19/187; H04N 19/184
See application file for complete search history.

(56) References Cited

U.S. PATENT DOCUMENTS 8,279,178 B2    10/2012    Krishnan et al.
9,741,782 B2    8/2017    Ma et al.
(Continued)

OTHER PUBLICATIONS

Pham, Nam, "Notice of Allowance", U.S. Appl. No. 15/719,072, filed Sep. 28, 2017; dated Mar. 4, 2019.

*Primary Examiner* — Nam D Pham
(74) *Attorney, Agent, or Firm* — Philip H. Burrus, IV

(57) ABSTRACT

A display has an array of pixel structures. Each pixel structure includes a plurality of electroluminescent elements. The array of pixel structures can be arranged on a substrate. One or more pixel structures selected from the array of pixel structures each include a microlens interspacing one or more of the electroluminescent elements. Image sensors can then receive light propagating through the microlens. One or more processors can synthesize images capture by the image sensors to form a composite image.

20 Claims, 12 Drawing Sheets

(51) Int. Cl.

| | | |
|---|---|---|
| *H04N 9/04* | (2006.01) | |
| *H04N 5/232* | (2006.01) | |
| *H01L 27/32* | (2006.01) | |
| *G02B 3/00* | (2006.01) | |
| *H04N 13/229* | (2018.01) | |
| *H01L 51/52* | (2006.01) | |
| *G06F 3/041* | (2006.01) | |
| *G09G 3/00* | (2006.01) | |
| *H04N 5/345* | (2011.01) | |
| *H01L 27/146* | (2006.01) | |
| *G02B 1/11* | (2015.01) | |

(56) References Cited

U.S. PATENT DOCUMENTS

2014/0023138 A1* 1/2014 Chen .................... H04N 19/597
                                                           375/240.12
2017/0272642 A1    9/2017 Zhang et al.

\* cited by examiner ical Field

This disclosure relates generally to displays, and more particularly to displays integrated with electronic devices.

Background Art

Portable electronic devices, such as smartphones and tablet computers, are ubiquitous in modern society. While mobile phones were once used only for making calls while "on the go," they are now used for countless activities other than making voice calls. These activities include sending and receiving text and multimedia messages, executing and managing financial transactions, consuming video and other multimedia content, and surfing the web.

There is a tension in the design of electronic devices between maximizing the size of a display upon which information is presented and keeping the overall size of the device such that it can economically and reasonably be held in the hand of a user. It would be advantageous to have an improved display.

Figure 1:
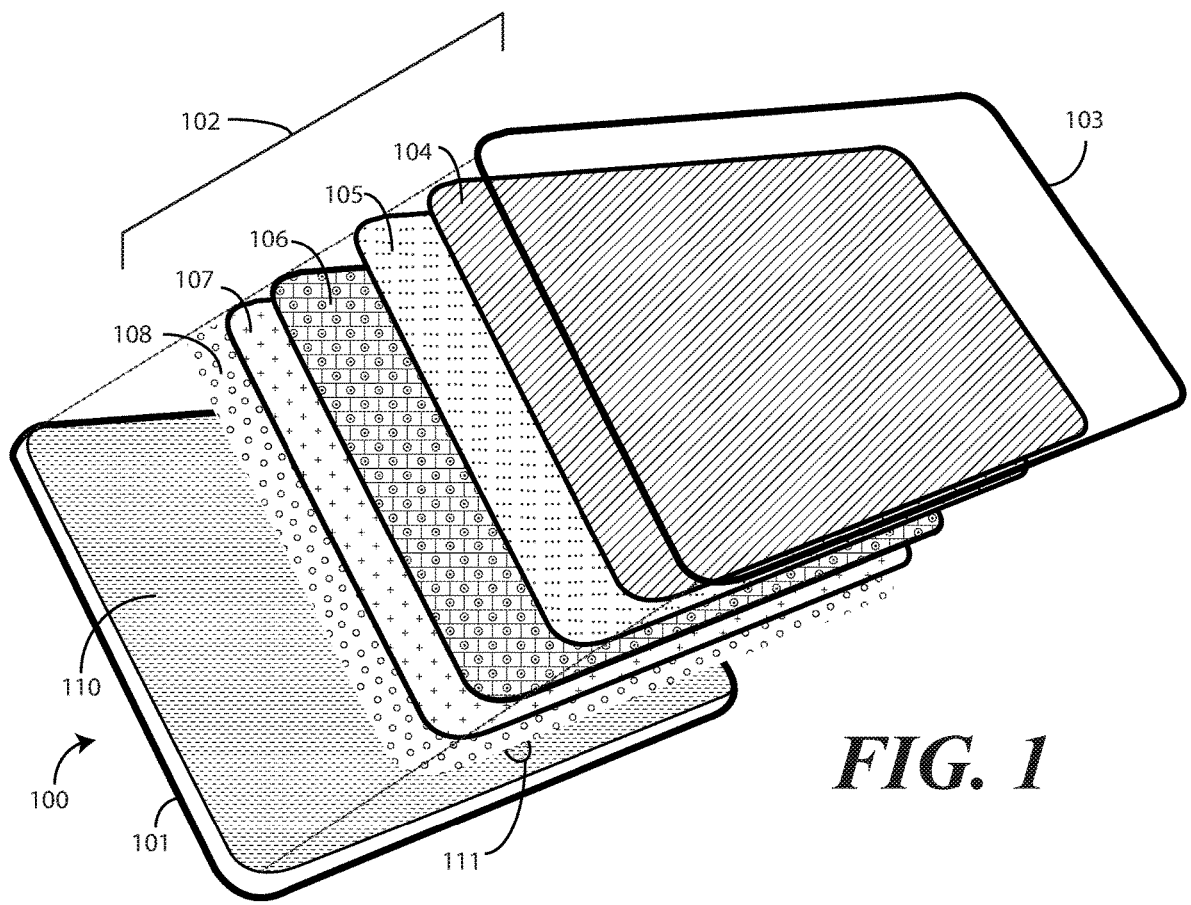
FIG. 1 illustrates one explanatory electronic device, shown in a partially exploded view, in accordance with one or more embodiments of the disclosure.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present disclosure.

DETAILED DESCRIPTION OF THE DRAWINGS

Before describing in detail embodiments that are in accordance with the present disclosure, it should be observed that the embodiments reside primarily in combinations of method steps and apparatus components related to displays having an array of microlenses interspaced among electroluminescent elements to deliver light to a corresponding array of image sensors disposed beneath the display. Any process descriptions or blocks in flow charts should be understood as representing modules, segments, or portions of code that include one or more executable instructions for implementing specific logical functions or steps in the process. Alternate implementations are included, and it will be clear that functions may be executed out of order from that shown or discussed, including substantially concurrently or in reverse order, depending on the functionality involved. Accordingly, the apparatus components and method steps have been represented where appropriate by conventional symbols in the drawings, showing only those specific details that are pertinent to understanding the embodiments of the present disclosure so as not to obscure the disclosure with details that will be readily apparent to those of ordinary skill in the art having the benefit of the description herein.

Embodiments of the disclosure do not recite the implementation of any commonplace business method aimed at processing business information, nor do they apply a known business process to the particular technological environment of the Internet. Moreover, embodiments of the disclosure do not create or alter contractual relations using generic computer functions and conventional network operations. Quite to the contrary, embodiments of the disclosure employ methods that, when applied to electronic device and/or user interface technology, improve the functioning of the electronic device itself by and improving the overall user experience to overcome problems specifically arising in the realm of the technology associated with electronic device user interaction. To wit, embodiments of the disclosure enable additional imaging and environmental sensing functions, through a display, to provide novel imaging and environmental sensing functions, as well as better automation and performance. Moreover, embodiments of the dis-

DISPLAY WITH INTERSPACED MICROLENSES AND CORRESPONDING DEVICES AND METHODS

CROSS REFERENCE TO PRIOR APPLICATIONS

This application is a continuation application claiming priority and benefit under 35 U.S.C. § 120 from U.S. application Ser. No. 15/719,072, filed Sep. 28, 2017, which is incorporated by reference for all purposes.

BACKGROUND

Techn closure provide these functions while offering a more aesthetically pleasing display surface in an electronic device.

It will be appreciated that embodiments of the disclosure described herein may be comprised of one or more conventional processors and unique stored program instructions that control the one or more processors to implement, in conjunction with certain non-processor circuits, some, most, or all of the functions of synthesizing images captured by an array of image sensors, each receiving light from a corresponding microlens, as described herein. The non-processor circuits may include, but are not limited to, a radio receiver, a radio transmitter, signal drivers, clock circuits, power source circuits, and user input devices. As such, these functions may be interpreted as steps of a method to perform image synthesis from a plurality of images captured by an array of image sensors receiving light from corresponding microlenses. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used. Thus, methods and means for these functions have been described herein. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ASICs with minimal experimentation.

Embodiments of the disclosure are now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on." Relational terms such as first and second, top and bottom, and the like may be used solely to distinguish one entity or action from another entity or action without necessarily requiring or implying any actual such relationship or order between such entities or actions.

As used herein, components may be "operatively coupled" when information can be sent between such components, even though there may be one or more intermediate or intervening components between, or along the connection path. The terms "substantially" and "about" are used to refer to dimensions, orientations, or alignments inclusive of manufacturing tolerances. Thus, a "substantially orthogonal" angle with a manufacturing tolerance of plus or minus two degrees would include all angles between 88 and 92, inclusive. Also, reference designators shown herein in parenthesis indicate components shown in a figure other than the one in discussion. For example, talking about a device (10) while discussing figure A would refer to an element, 10, shown in figure other than figure A.

Embodiments of the present disclosure provide a display that integrates a camera or a multi-camera array system into a display without interrupting the pixels of the display. In one or more embodiments, an array of pixel structures of a display each comprise a plurality of electroluminescent elements. Interspaced between one or more of the electroluminescent elements are one or more microlenses. Although the illustration of the microlenses shows single-element lenses, in practical use, each microlens may consists of multiple lenses arranged in multiple groups. Furthermore, microlens configurations may be different for different miniature cameras in order to achieve different purposes. An image sensor is then positioned behind each microlens to receive light propagating through the microlens for the capture of images. One or more processors operable with the display can then synthesize images from the array of image sensors, each receiving light to capture an image through a corresponding microlens, to form a composite image.

Advantageously, a "camera" facing outward from the display is formed from an array of image sensors disposed behind the substrate carrying the electroluminescent elements. Each image sensor receives light from a microlens that interspaces electroluminescent elements, but does not interrupt the pixels of the display. Advantageously, a "continuous" display can be placed along a major surface of the device without any requirement for "non-display" real estate to be allocated to a camera. As such, a truly "borderless" display can be achieved without sacrificing the ability to capture images from that side of the device.

Embodiments of the disclosure thus provide one or more displays for electronic devices that allow imagers, image sensors, and other components to be arranged beneath portions of the display, while allowing the entire surface of the display to be used normally. In one or more embodiments, the display integrates microlenses between electroluminescent elements of, for example, organic light emitting diode display pixels to provide portions of the display through which light can propagate. Sensors, such as an image sensor, can then be situated beneath the microlenses so as to receive light or other signals through the microlenses.

Advantageously, locating the imager and other sensors beneath the microlenses allows these devices to be concealed while still maintaining the ability to present information on all portions of the display. This allows the area upon which information is presented to become larger, without requiring a larger form factor for the overall device.

In one or more embodiments, the sensors can be controlled and synchronized with the operation of the display to achieve a time-sequential operation. Illustrating by example, when the imager is capturing an image, the predefined portion of the display can be turned OFF to allow the imager to capture the image. Said differently, when the imager captures the image the transparent organic light emitting diode display pixels, sub-pixels, or partial sub-pixels can be turned OFF so that they do not deliver light to the imager while the image is captured. However, in other embodiments the image sensors can capture images while the display is operating normally, i.e., when the pixels are ON. An anti-reflective coating on the device cover glass can be used to reduce the back-reflected glare. Alternatively, some or all of the cameras can be strategically placed in typically dark areas, such as the notification area, to reduce glare.

Advantageously, embodiments of the disclosure allow for a "borderless" display that can extend across the entirety, or nearly the entirety, of a major surface of an electronic device. In prior art devices, the area of the display had to be smaller than the area of a major surface, e.g., the front, of an electronic device to accommodate forward facing cameras, proximity sensors, and other sensors. With embodiments of the present disclosure, such devices can be hidden behind the display while maintaining key optical characteristics of the display.

Turning now to FIG. 1, illustrated therein is one explanatory electronic device 100 configured in accordance with one or more embodiments of the disclosure. The electronic device 100 of FIG. 1 is a portable electronic device, and is shown as a tablet computer for illustrative purposes. However, it should be obvious to those of ordinary skill in the art having the benefit of this disclosure that other electronic devices may be substituted for the explanatory tablet computer of FIG. 1. For example, the electronic device 100 could equally be a mobile phone, conventional desktop computer, a digital camera, a palm-top computer, a smartphone, a gaming device, a media player, television display, display monitor, or other display device. The electronic device 100 could also be a wearable device, such as a smart watch, pendant, or other wearable device.

This illustrative electronic device 100 is shown in FIG. 1 in a partially exploded view so that various components can more clearly be seen. The electronic device 100 includes a housing 101, a display 102, and a fascia 103. Starting from the top, a fascia 103 is provided. In this illustrative embodiment, the fascia 103 defines a major face of the housing 101 disposed above the display 102. The fascia 103 may be manufactured from glass or a thin film sheet. The fascia 103 is a covering or housing, which may or may not be detachable. Suitable materials for manufacturing the cover layer include clear or translucent plastic film, glass, plastic, or reinforced glass. Reinforced glass can comprise glass strengthened by a process such as a chemical or heat treatment. In one or more embodiments, the fascia 103 is less than one millimeter thick. For example, in one embodiment the fascia 103 is about 0.5 millimeters thick.

The fascia 103 may also include a ultra-violet barrier. Such a barrier is useful both in improving the visibility of the display 102 and in protecting internal components of the electronic device 100. Printing may be desired on the front face of the fascia 103 for various reasons. For example, a subtle textural printing or overlay printing may be desirable to provide a translucent matte finish atop the fascia 103. Such a finish is useful to prevent cosmetic blemishing from sharp objects or fingerprints. The fascia 103 can include a plurality of indium tin oxide or other electrodes, which function as a capacitive sensor, to convert the display 102 to a touch-sensitive display. Where configured to be touch sensitive, users can deliver user input to the display 102 by delivering touch input from a finger, stylus, or other objects disposed proximately with the display.

Beneath the fascia 103 is disposed the display 102. The display 102 is supported by the housing 101 of the electronic device 100. In this illustrative embodiment, the display 102 is disposed between the housing 101 and the fascia 103. In one or more embodiments, the display 102 comprises an array of pixels, where each pixel comprises a plurality of electroluminescent elements. One example of such an array will be described below with reference to FIGS. 3-4. Still others will be obvious to those of ordinary skill in the art having the benefit of this disclosure.

In one embodiment, the display 102 comprises a plurality of layers. Beginning at the top, an optional polarizer 104 is disposed beneath the fascia 103. Light propagating from the environment through the fascia 103 passes through the polarizer 104 and is accordingly polarized. In one or more embodiments, the polarizer 104 is about fifty micrometers in thickness. The polarizer 104 can optionally be coupled to the fascia 103 with an optically transparent adhesive in one or more embodiments.

Beneath the polarizer 104 is a first substrate 105. In one or more embodiments, the first substrate 105 is optically transparent. The first substrate 105 has a thickness of about 100 micrometers in one embodiment.

The display 102 can optionally be touch sensitive. Illustrating by example, the first substrate 105, in one or more embodiments, has an electrode structure disposed thereon. In one or more embodiments, the electrode structure comprises one or more optically transparent electrodes. These optically transparent electrodes can be manufactured by depositing indium-tin oxide ($In_2O_3$—$SnO_2$), often in the shape of pixels, to apply selective electric fields to the pixels of the organic light emitting diode layer 106 disposed beneath the first substrate 105, thereby presenting images to a user on the display 102. One or more processors (shown below in FIG. 2) can be operable with the electrode structure to cause the electroluminescent elements of the organic light emitting diode layer 106 to present images, text, and other indicia along the surface of the display 102.

Beneath the first substrate 105 is disposed an organic light emitting diode layer 106. In one or more embodiments, the organic light emitting diode layer 106 comprises one or more electroluminescent elements. In one embodiment, the one or more electroluminescent elements define an array of pixels. Additional details of these electroluminescent elements, and the pixels they define, will be described below with reference to FIGS. 3-4.

The electroluminescent elements, when stimulated by an electric field, emit light through carrier injection and recombination. When a cathode and anode apply an electric field to the electroluminescent elements, the electric field causes electrons and holes to be injected into an electron transport layer and a hole transport layer of the electroluminescent elements. The electrons and holes migrate to a light-emitting layer and meet to create "excitons" that emit visible light through radiative relaxation.

As will be described in more detail with reference to FIG. 4 below, in one embodiment the organic light emitting diode layer 106 is selectively deposited along either the first substrate 105 or the second substrate 107 as individual electroluminescent elements, with space between each electroluminescent element. One or more electroluminescent elements then define a pixel. For example, a green electroluminescent element, a blue electroluminescent element, and a red electroluminescent element may define a pixel. Due to differences in brightness, these electroluminescent elements may be of different size. Additionally, multiple electroluminescent elements of one color may be used, while single electroluminescent elements of other colors may be used. Two green electroluminescent elements, one blue electroluminescent element, and one red electroluminescent element may define a pixel, and so forth.

Beneath the organic light emitting diode layer 106 is a second substrate 107. In one embodiment, the second substrate 107 has a thickness of about 100 micrometers. In one embodiment, the second substrate 107 includes an electrode structure deposited thereon. In one embodiment, the electrode structure comprises a plurality of transistors deposited along the first substrate as a thin film transistor layer. The thin film transistor layer can be deposited directly upon the second substrate 107 in one embodiment. Alternatively, a lamination adhesive can couple the thin film transistor layer to the second substrate 107.

Disposed beneath the second substrate 107 is an array of microlenses 108. It should be noted that while the each microlens of the array of microlens 108 is shown for illustrative purposes as a singular component, each of the microlenses may also consist of one or more elements arranged in one or more groups. The microlenses will be described in more detail with reference to FIG. 3 below. In one or more embodiments, the microlenses are molded glass having a diameter of less than 50 micrometers. For example, in one embodiment the microlenses each have a diameter of about 25 micrometers. Accordingly, in one or more embodiments the microlenses can interspace one or more electroluminescent elements of each pixel structure. Said differently, in one or more embodiments the microlenses can be situated between electroluminescent elements of the pixels without overlapping those electroluminescent elements. Advantageously, this allows light to propagate through the microlenses between the electroluminescent elements of the organic light emitting diode layer 106. Suitable materials for manufacturing the array of microlenses 108 include clear or translucent plastic film, glass, plastic, or reinforced glass.

To accommodate the interspacing of microlenses between electroluminescent elements of the organic light emitting diode layer 106, in this illustrative embodiment the organic light emitting diode layer 106 is an active matrix organic light emitting diode (AMOLED) layer. Organic light emitting diode displays come in two varieties: passive and active. The latter is a direct addressing mode where thin film transistors on the second substrate 107 can independently control the electroluminescent elements through thin-film-transistor addressing. While an AMOLED display is preferred, it should be noted that other types of displays employing optically transparent substrates will be suitable for use with microlenses and image sensors configured in accordance with embodiments of the disclosure, as will be obvious to those of ordinary skill in the art having the benefit of this disclosure.

Beneath the array of microlenses 108 is an optical barrier array 109 in one or more embodiments. As will be described in more detail below with reference to FIG. 3, in one or more embodiments the optical barrier array has a height of one to two millimeters and prevents light from one microlens in the array of microlenses from spilling over to an image sensor with which it is not associated.

Beneath the optical barrier array 109 is an array of image sensors 110. In one embodiment, each image sensor in the array of image sensors 110 comprises a digital image sensor. In one or more embodiments, this array of image sensors 110 is disposed upon a substrate. In one or more embodiments, each image sensor of the array of image sensors 110 corresponds to a microlens of the array of microlenses 108. For example, in one embodiment light propagating through a microlens reaches only a single image sensor with which it corresponds. In one or more embodiments, optical barriers can cordon off each microlens/image sensor pair from others so that light propagating through a particular microlens only reaches its corresponding image sensor. This will be described in more detail with reference to FIG. 3 below. In one or more embodiments groups of image sensors selected from the array of image sensors 110 can be used collectively to create an imager or image capture device.

Features can be incorporated into the housing 101 beneath the fascia 103. Examples of such features include a fingerprint reader 111 or touch sensitive surface. Others will be obvious to those of ordinary skill in the art having the benefit of this disclosure.

Figure 2:
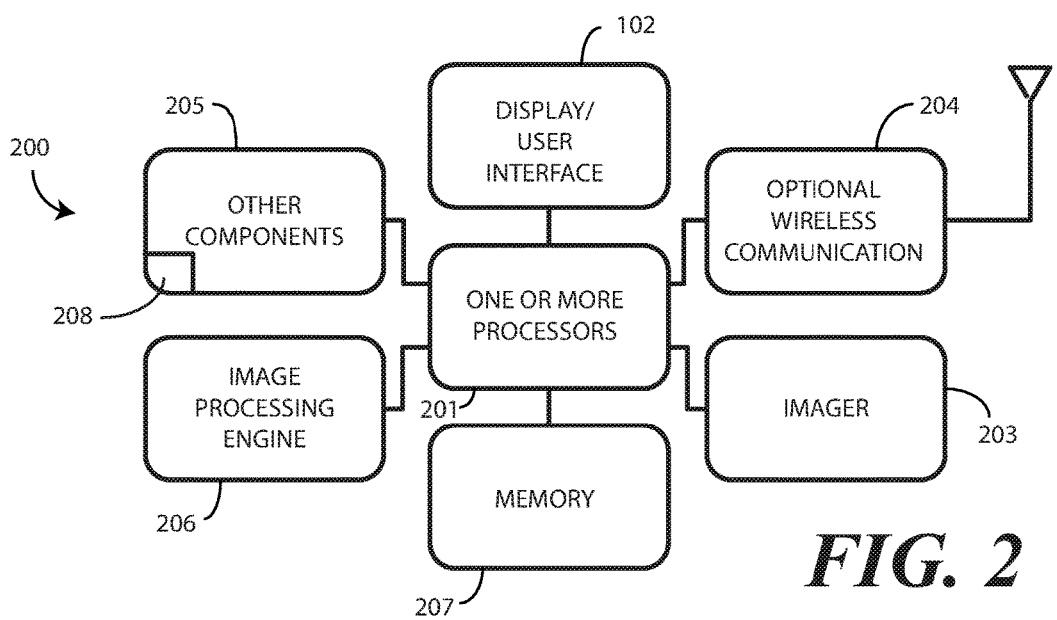
FIG. 2 illustrates a schematic block diagram of one explanatory electronic device in accordance with one or more embodiments of the disclosure.

Turning now to FIG. 2, illustrated therein is a schematic block diagram 200 of an explanatory electronic device configured in accordance with one or more embodiments of the disclosure. In one embodiment, the electronic device includes one or more processors 201. The one or more processors 201 are operable with the display 102 and other components of the electronic devices configured in accordance with embodiments of the disclosure. The one or more processors 201 can include a microprocessor, a group of processing components, one or more ASICs, programmable logic, or other type of processing device. In one or more embodiments, the one or more processors 201 can include a dedicated image signal processor. The one or more processors 201 can be operable with the various components of the electronic devices configured in accordance with embodiments of the disclosure. The one or more processors 201 can be configured to process and execute executable software code to perform the various functions of the electronic devices configured in accordance with embodiments of the disclosure.

A storage device, such as memory 207, can optionally store the executable software code used by the one or more processors 201 during operation. The memory 207 may include either or both static and dynamic memory components, may be used for storing both embedded code and user data. The software code can embody program instructions and methods to operate the various functions of the electronic device devices configured in accordance with embodiments of the disclosure, and also to execute software or firmware applications and modules. The one or more processors 201 can execute this software or firmware, and/or interact with modules, to provide device functionality.

In this illustrative embodiment, the schematic block diagram 200 also includes an optional communication circuit 204 that can be configured for wired or wireless communication with one or more other devices or networks. The networks can include a wide area network, a local area network, and/or personal area network. Examples of wide area networks include GSM, CDMA, W-CDMA, CDMA-2000, iDEN, TDMA, 2.5 Generation 3GPP GSM networks, 3rd Generation 3GPP WCDMA networks, 3GPP Long Term Evolution (LTE) networks, and 3GPP2 CDMA communication networks, UMTS networks, E-UTRA networks, GPRS networks, iDEN networks, and other networks.

The communication circuit 204 may also utilize wireless technology for communication, such as, but are not limited to, peer-to-peer or ad hoc communications such as HomeRF, Bluetooth and IEEE 802.11 (a, b, g or n); and other forms of wireless communication such as infrared technology. The communication circuit 204 can include wireless communication circuitry, one of a receiver, a transmitter, or transceiver, and one or more antennas.

The one or more processors 201 can also be operable with other components 205. The other components 205 can include an acoustic detector, such as a microphone. The other components 205 can also include one or more proximity sensors to detect the presence of nearby objects. The other components 205 may include video input components such as optical sensors, mechanical input components such as buttons, touch pad sensors, touch screen sensors, capacitive sensors, motion detectors 208, and switches. Where motion detectors 208 are included, they can be configured in several different ways. For example, in one embodiment the motion detector 208 is a simple thermopile that receives infrared emissions from a person's body. In other embodiments, the motion detector 208 can be a passive infrared sensor.

In still other embodiments, a subset of the array of image sensors (110) can comprise low-power single or multiple segment sensors that define the motion detector 208. Alternatively, the subset of the array of image sensors (110) can comprise Complementary Metal Oxide Semiconductor (CMOS) sensors with low-power mode that define the motion detector 208 and detect motion or other environmental changes. In one or more embodiments, this subset of the array of image sensors (110) can operate either in visible or near-infrared spectrum. Some of the image sensors in the subset of the array of image sensors (110) can operate at different wavelengths capture different facial and iris features.

Where motion detectors 208 are included, they can be operable with the one or more processors 201. Illustrating by example, the motion detector 208 can actuate the array of image sensors (110), or a subset thereof, when motion is detected. When this subset of the array of image sensors (110) detects motion, it can actuate other image sensors so that higher resolution images can be captured.

Similarly, the other components 205 can include output components such as video, audio, and/or mechanical outputs. Other examples of output components include audio output components such as speaker ports or other alarms and/or buzzers and/or a mechanical output component such as vibrating or motion-based mechanisms. The other components 205 may further include an accelerometer to show vertical orientation, constant tilt and/or whether the device is stationary.

The one or more processors 201 can be responsible for performing the primary functions of the electronic devices configured in accordance with one or more embodiments of the disclosure. For example, in one embodiment the one or more processors 201 comprise one or more circuits operable with one or more user interface devices, which can include the display 102, to present information to a user. The executable software code used by the one or more processors 201 can be configured as one or more modules that are operable with the one or more processors 201. Such modules can store instructions, control algorithms, and so forth. In one embodiment, the modules include an image-processing engine 206. In one embodiment, the image-processing engine 206 comprises software stored in the memory 207. However, in another embodiment the image-processing engine 206 can comprise hardware components or firmware components integrated into the one or more processors 201 as well.

In one or more embodiments, the image-processing engine 206 is operable with an imager 203 defined by groups of image sensors selected from the array of image sensors (110). In one or more embodiments, the one or more processors 201 are operable with the display 102 and the image-processing engine 206 to synthesize images from a group of image sensors selected from the array of image sensors (110) to form a composite image. For example, when a select number of image sensors receive light propagating through a corresponding microlens, the one or more processors can cause those image sensors to capture an image. As each image sensor is quite small, e.g., on the order of ten to twenty micrometers in diameter, each captures a tiny image. Using the image-processing engine 206, the one or more processors 201 can stitch these tiny images together to form a composite image in one or more embodiments.

It is to be understood that the schematic block diagram 200 of FIG. 2 is provided for illustrative purposes only and for illustrating components of explanatory electronic devices configured in accordance with one or more embodiments of the disclosure, and is not intended to be a complete schematic diagram of the various components required for an electronic device. Therefore, other electronic devices in accordance with embodiments of the disclosure may include various other components not shown in FIG. 2, or may include a combination of two or more components or a division of a particular component into two or more separate components, and still be within the scope of the present disclosure.

Figure 3:
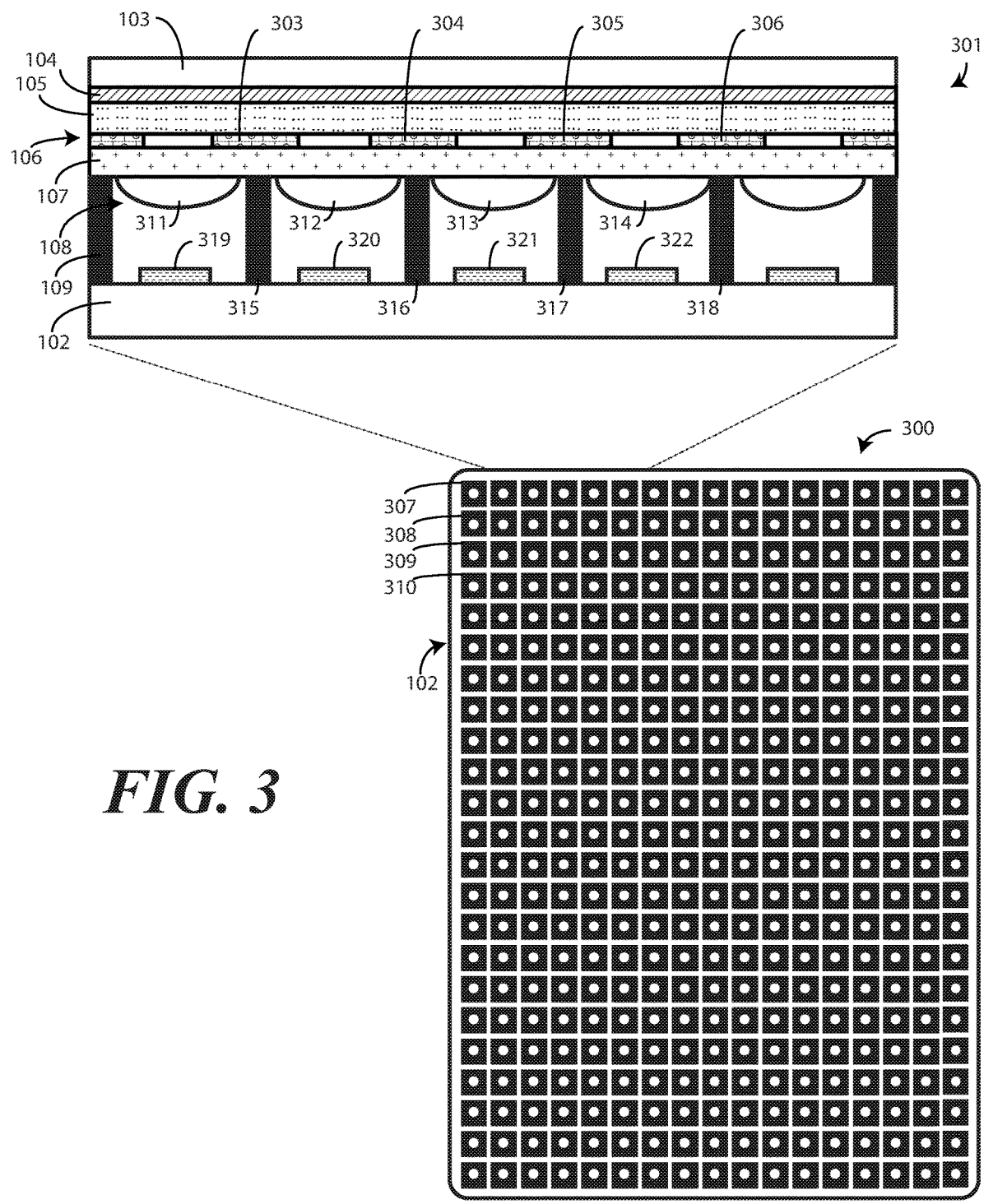
FIG. 3 illustrates one explanatory display in accordance with one or more embodiments of the disclosure.

Turning now to FIG. 3, illustrated therein is the display 102 of FIG. 1. The display 102 is shown both in a planar view 300 and a cross-sectional view 301 so that particular features of the display 102 can be illustrated in more detail.

In the sectional view 301, the various layers of the display 102 can be seen. The fascia 103 is disposed on the top of the stack, with the polarizer 104 is disposed beneath the fascia 103. Beneath the polarizer 104 is a first substrate 105.

Beneath the first substrate 105 is disposed an organic light emitting diode layer 106. As shown in FIG. 3, in one or more embodiments, the organic light emitting diode layer 106 comprises one or more electroluminescent elements 303, 304, 305, 306. In one embodiment, the one or more electroluminescent elements 303, 304, 305, 306 are arranged along the first substrate 105. In another embodiment, the one or more electroluminescent elements 303, 304, 305, 306 are arranged along the second substrate 107. Other configurations will be obvious to those of ordinary skill in the art having the benefit of this disclosure.

The one or more electroluminescent elements 303, 304, 305, 306 define an array of pixel structures 307, 308, 309, 310 in one or more embodiments. In one or more embodiments, the array of pixel structures 307, 308, 309, 310 has a pitch of between 60 and 100 micrometers. In one or more embodiments, each pixel structure 307, 308, 309, 310 comprises a plurality of electroluminescent elements 303, 304, 305, 306 in one or more embodiments. For example, in one embodiment each pixel structure 307, 308, 309, 310 comprises three electroluminescent elements 303, 304, 305. In another embodiment, each pixel structure 307, 308, 309, 310 comprises four electroluminescent elements 303, 304, 305, 306. Other numbers of electroluminescent elements 303, 304, 305, 306 defining a pixel structure 307, 308, 309, 310 will be obvious to those of ordinary skill in the art having the benefit of this disclosure.

Beneath the organic light emitting diode layer 106 is a second substrate 107. Disposed beneath the second substrate 107 is an array of microlenses 108. The microlenses 311, 312, 313, 314 can be manufactured from molded glass. The microlenses 311, 312, 313, 314 can be adhered to the second substrate 107. The microlenses 311, 312, 313, 314 can have a diameter of less than 50 micrometers. For example, in one embodiment the microlenses 311, 312, 313, 314 each have a diameter of about 25 micrometers. Although the microlenses 311,312,313,314 shown in 300 consists of similar, simple plano-convex lenses, in one or more other embodiments each microlens 311,312,313,314 could comprise of multiple elements in multiple groups. Additionally, the collective lens configuration defined by one or more microlenses 311,312,313,314 can be different for different miniature cameras, as will be described below with reference to FIG. 13. These miniature cameras may also operate at different wavelengths, for example in a selected band from 400 to 1100 nanometers.

Optionally, beneath the array of microlenses 108 is an optical barrier array 109 in one or more embodiments. The optical barrier array 109 comprises a plurality of optical barriers 315, 316, 317, 318 that prevent light propagating through a particular microlens 311 from reaching anything other than the corresponding image sensor. The optical barriers 315, 316, 317, 318 can be manufactured from plastic or other optically non-transparent materials. In one or more embodiments the optical barriers 315, 316, 317, 318 each have a height of one to two millimeters.

Beneath the optical barrier array 109 is an array of image sensors 110. In one embodiment, each image sensor 319, 320, 321, 322 in the array of image sensors 110 comprises a digital image sensor. In one or more embodiments, each image sensor 319, 320, 321, 322 is disposed upon a substrate 302. In this illustrative embodiment, substrate 302 is oriented substantially parallel with the first substrate 105 and the second substrate 107.

In one or more embodiments, each image sensor 319, 320, 321, 322 of the array of image sensors 110 corresponds to a microlens 311, 312, 313, 314 of the array of microlenses 108. For example, in this illustrative embodiment, image sensor 319 corresponds to microlens 311, while image sensor 320 corresponds to microlens 312, and so forth. As such, in this embodiment each image sensor 319, 320, 321, 322 of the array of image sensors 110 corresponds to a microlens 311,312,313,314 of the array of microlenses 108 on a one-to-one basis, with a single microlens 311 corresponding to a single image sensor 320. In other embodiments, two or more microlenses can correspond to a single image sensor. In this illustrative embodiment, image sensors of adjacent pixel structures are separated by an optical barrier such that each image sensor captures light from a single microlens.

In one embodiment light propagating through a microlens 311 reaches only a single image sensor 319 with which it corresponds. The optical barriers 315, 316, 317, 318 can cordon off each microlens/image sensor pair from others so that light propagating through a particular microlens 311 only reaches its corresponding image sensor 319. For example, optical barrier 315 prevents light propagating through microlens 311 from reaching image sensor 320, and so forth. In one or more embodiments groups of image sensors, e.g., image sensors 319,320,321 selected from the array of image sensors 110 can be used collectively to create an imager or image capture device.

Figure 4:
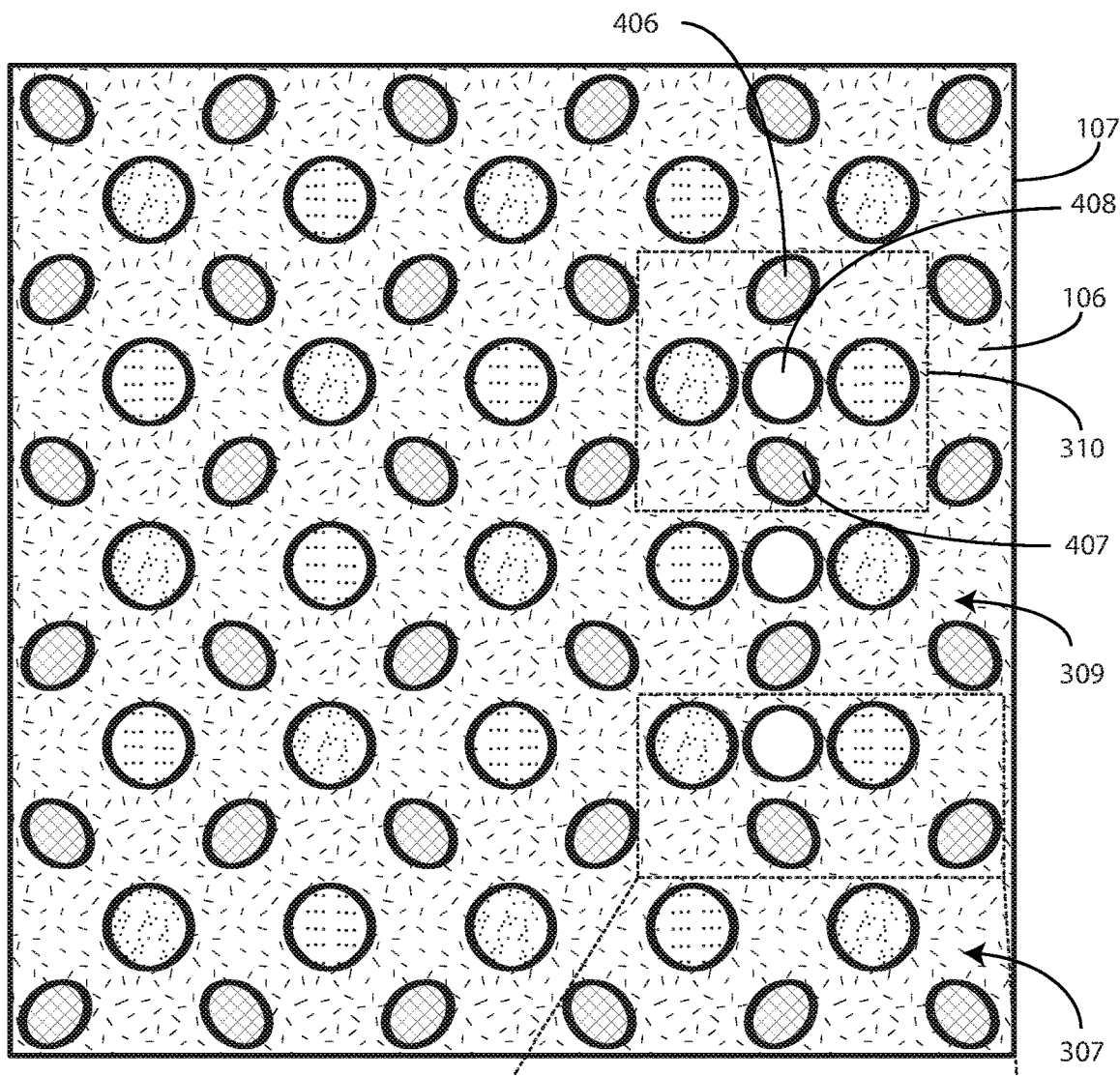
FIG. 4 illustrates one explanatory electronic device in accordance with one or more embodiments of the disclosure.
Figure 4:
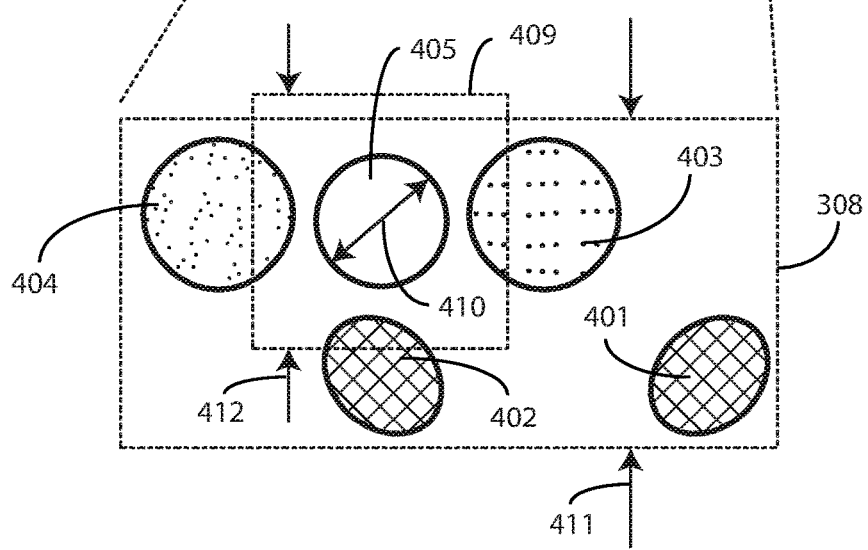

Turning now to FIG. 4, illustrated therein is the array of pixel structures 307, 308, 309, 310 in a magnified view. As shown, each pixel structure 307, 308, 309, 310 comprises a plurality of electro-luminescent elements. For example, pixel structure 308, shown in a magnified view, includes four electroluminescent elements 401, 402, 403, 404. In this particular example, electroluminescent element 401 and electroluminescent element 402 are green electroluminescent elements in this illustrative embodiment, while electroluminescent element 403 is a blue electroluminescent element and electroluminescent element 404 is a red electroluminescent element. Due to differences in brightness, these electroluminescent elements may be of different size. In this illustrative embodiment electroluminescent element 401 and electroluminescent element 402 are smaller than are electroluminescent element 403 and electroluminescent element 404.

As mentioned above, in one embodiment the organic light emitting diode layer 106 is selectively deposited along either the first substrate (105) or the second substrate 107 as individual electroluminescent elements 401, 402, 403, 404. Accordingly, space exists between each electroluminescent element 401, 402, 403, 404. Accordingly, in one or more embodiments a microlenses 405 can interspace one or more electroluminescent elements, e.g., electroluminescent element 403 and electroluminescent element 404, of each pixel structure 308.

In this illustrative embodiment, the microlens 405 interspaces the red electroluminescent element and the blue electroluminescent element. In other embodiments, such as where a pixel structure 310 comprises a first green electroluminescent element 406 and a second green electroluminescent element 407, the microlens 408 can interspace the first green electroluminescent element 406 and the second green electroluminescent element 407 in addition to the red electroluminescent element and the blue electroluminescent element, as shown at pixel structure 310.

Accordingly, in the illustrative embodiment of FIG. 4, the microlenses 405, 408 can be situated between electroluminescent elements 403, 404 of the pixel structures 308 without overlapping those electroluminescent elements 403, 404. Advantageously, this allows light to propagate through the microlenses 405, 408 between the electroluminescent elements 403, 404 of the organic light emitting diode layer 106. In one or more embodiments, each image sensor corresponding to the microlenses 405, 408 receives the light propagating through the corresponding microlens 405, 408 and captures an image. For example, image sensor 409 receives light propagating through microlens 405, while optical barriers (315, 316, 317, 318) separate image sensors of adjacent pixel structures, e.g., pixel structures 308, 310 such that each image sensor receives light from a single microlens. In this embodiment, image sensor 409 receives light only from microlens 405.

In one or more embodiments, a diameter 410 of the microlens 405 present in each pixel structure 308 is less than half the diameter 411 of the pixel structure 308. For example, in one embodiment the diameter 410 of the microlens 405 is about twenty-five micrometers, while the diameter 411 of the pixel structure 308 within which the microlens 405 is disposed is about 80 micrometers.

The diameter 412 of the image sensor 409 can vary. For example, the diameter 412 of the image sensor 409, due to the optical effects of the microlens 405 can be between 60 and 100 micrometers in one or more embodiments. This allows for an image sensor having a 60-100 micrometer sensor region with a 25-micrometer "aperture" defined by the microlens 405.

Figure 5:
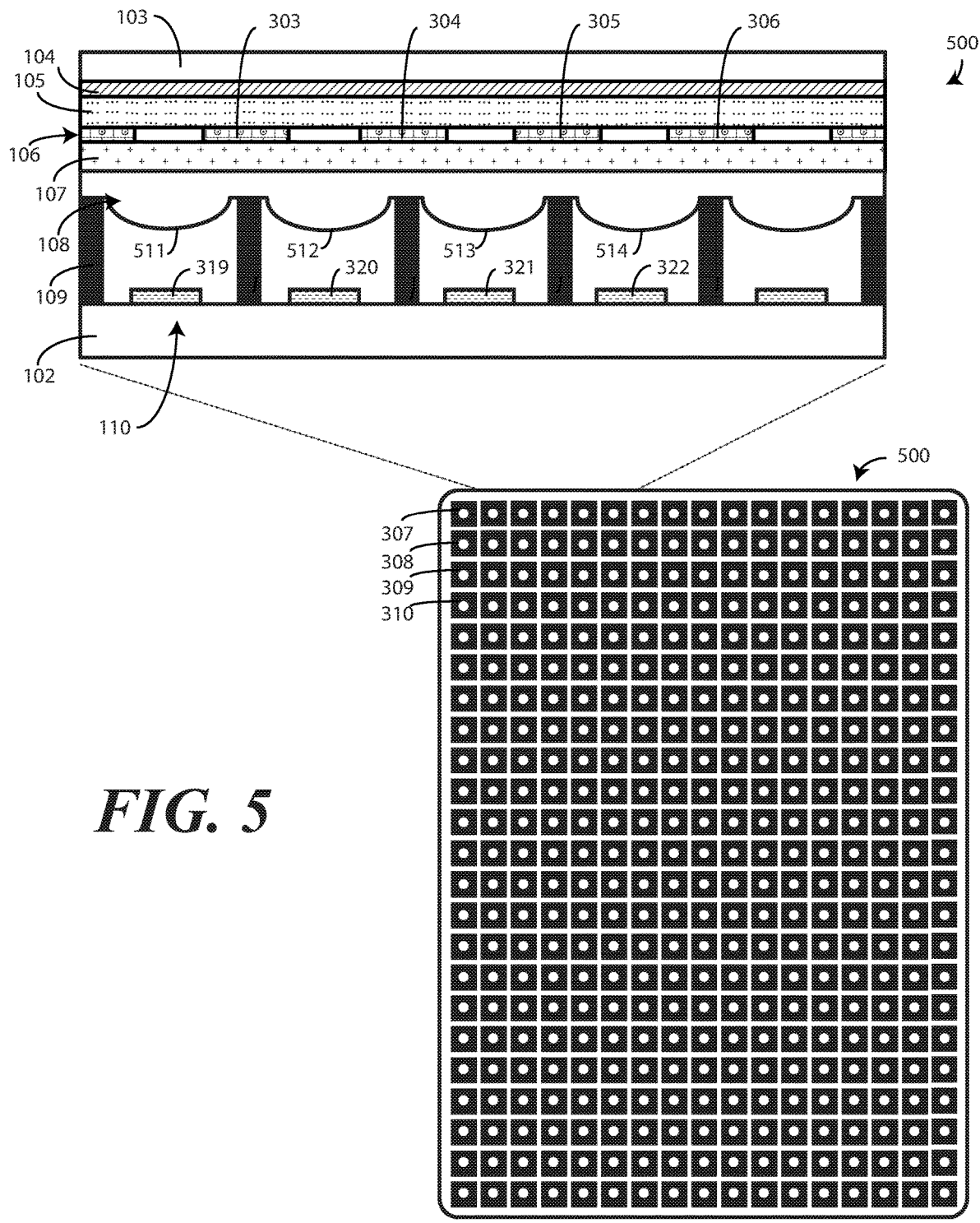
FIG. 5 illustrates another explanatory display in accordance with one or more embodiments of the disclosure.

Turning now to FIG. 5, illustrated therein is an alternate display 500 configured in accordance with one or more embodiments of the disclosure. As before, the display 500 includes various layers. In the sectional view of FIG. 5, the various layers of the display 500 can be seen.

A fascia 103 is disposed on the top of the stack, with the polarizer 104 is disposed beneath the fascia 103. Beneath the polarizer 104 is a first substrate 105. Beneath the first substrate 105 is disposed an organic light emitting diode layer 106. The organic light emitting diode layer 106 comprises one or more electroluminescent elements 303, 304, 305, 306. The one or more electroluminescent elements 303, 304, 305, 306 define an array of pixel structures 307, 308, 309, 310 as previously described. Beneath the organic light emitting diode layer 106 is a second substrate 107.

Disposed beneath the second substrate 107 is an array of microlenses 108. Rather than being individual components, as was the case above with reference to FIG. 3, in this illustrative embodiment the microlenses 311, 312, 313, 314 are manufactured as a continuous sheet of molded glass. In case of lenses with multiple elements, multiple sheets of glass can be used to fabricate different element layers. This simplifies manufacture, as individual microlenses do not have to be separately placed. The continuous sheet of molded glass can simply be attached to the second substrate. In one or more embodiments, the single sheet of molded glass and the second substrate 107 are a singular part, with the lower surface of the second substrate 107 defining the microlenses 311, 312, 313, 314.

Beneath the array of microlenses 108 is an optical barrier array 109 in one or more embodiments. Beneath the optical barrier array 109 is an array of image sensors 110. In one or more embodiments, each image sensor 319, 320, 321, 322 of the array of image sensors 110 corresponds to a microlens 311,312,313,314 of the array of microlenses 108. For example, in this illustrative embodiment, image sensor 319 corresponds to microlens 311, while image sensor 320 corresponds to microlens 312, and so forth. Light, therefore, propagating through a microlens 311 reaches only a single image sensor 319 with which it corresponds. In one or more embodiments groups of image sensors, e.g., image sensors 319, 320, 321 selected from the array of image sensors 110 can be used collectively to create an imager or image capture device. The one or more processors (201) operable with the display 500 can synthesize images from a group of image sensors 319, 320, 321 to form a composite image.

Figure 6:
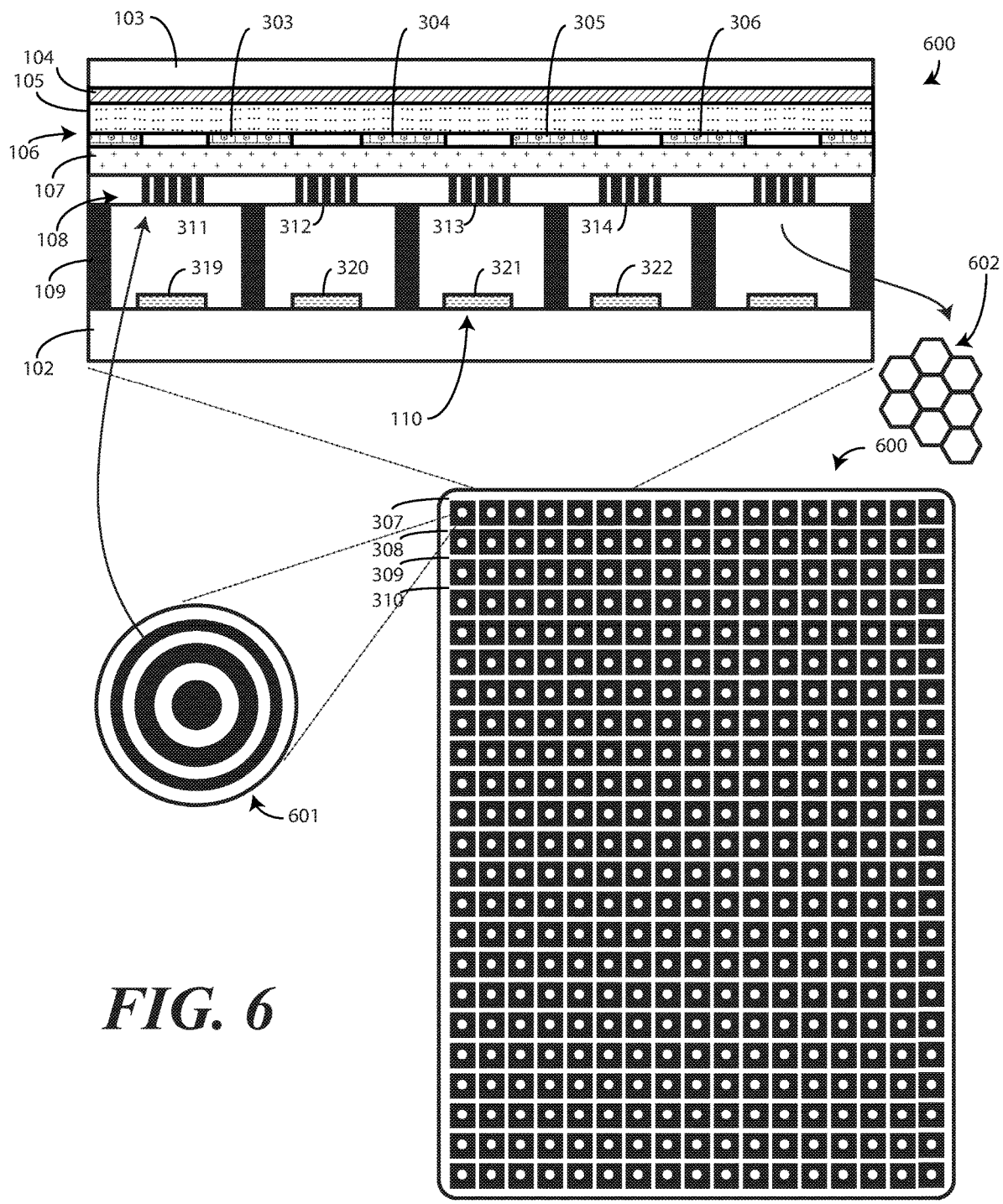
FIG. 6 illustrates yet another explanatory display in accordance with one or more embodiments of the disclosure.

Turning now to FIG. 6, illustrated therein is yet another display 600 configured in accordance with one or more embodiments of the disclosure. As before, the display 600 includes various layers. In the sectional view of FIG. 6, the various layers of the display 600 can be seen.

A fascia 103 is disposed on the top of the stack, with the polarizer 104 is disposed beneath the fascia 103. Beneath the polarizer 104 is a first substrate 105. Beneath the first substrate 105 is disposed an organic light emitting diode layer 106. The organic light emitting diode layer 106 comprises one or more electroluminescent elements 303, 304, 305, 306. The one or more electroluminescent elements 303, 304, 305, 306 define an array of pixel structures 307, 308, 309, 310 as previously described. Beneath the organic light emitting diode layer 106 is a second substrate 107.

Disposed beneath the second substrate 107 is an array of microlenses 108. As was the case with the embodiment of FIG. 5, rather than being individual components, as was the case above with reference to FIG. 3, in this illustrative embodiment the microlenses 511, 512, 513, 514 are manufactured as a continuous sheet of molded glass. However, rather than having convex surfaces as did the microlenses (311, 312, 313, 314) of FIGS. 3 and 5, in this illustrative embodiment each microlens 511, 512, 513, 514 is configured as a Fresnel lens 601.

Fresnel lenses 601, known in the art, allow for constructions without the mass and volume of material that is required by a conventional lens and can be fabricated lithographically. Accordingly, by using a Fresnel lens 601, the convex surfaces are not required. Nanostructures 602, which can be configured in a honeycomb arrangement, can be deposited on the substrate defining the microlenses 511, 512, 513, 514 to define the Fresnel lens 601. For example, dielectric material can be deposited along the second substrate 107 to define the Fresnel lens 601. The features defined by the dielectric material can have a size that is similar to that of the wavelengths of visible light, such as between 100 and 1000 nanometers. The dielectric material can be deposited as a Fresnel zone plate in a binary or blazed profile, as shown at the Fresnel lens 601, or can be a series of nano-posts with a range of sizes as shown at the nanostructures 602. Other techniques for defining the Fresnel lens 601 will be obvious to those of ordinary skill in the art having the benefit of this disclosure. As before, the material defining the microlenses 511, 512, 513, 514 and the second substrate 107 can be a singular part.

Beneath the array of microlenses 108 is an optical barrier array 109 in one or more embodiments. Beneath the optical barrier array 109 is an array of image sensors 110. In one or more embodiments, each image sensor 319, 320, 321, 322 of the array of image sensors 110 corresponds to a microlens 311, 312, 313, 314 of the array of microlenses 108. For example, in this illustrative embodiment, image sensor 319 corresponds to microlens 311, while image sensor 320 corresponds to microlens 312, and so forth. Light, therefore, propagating through a microlens 311 reaches only a single image sensor 319 with which it corresponds. In one or more embodiments groups of image sensors, e.g., image sensors 319, 320, 321 selected from the array of image sensors 110 can be used collectively to create an imager or image capture device. The one or more processors (201) operable with the display 500 can synthesize images from a group of image sensors 319, 320, 321 to form a composite image.

As noted above, embodiments of the present disclosure provide a display that integrates a camera or camera system into a display without interrupting the pixels of the display. In each embodiment of FIGS. 3, 5, and 6, an array of pixel structures defines a display. Each pixel structure comprises a plurality of electroluminescent elements. Interspaced between one or more of the electroluminescent elements is a microlens. An image sensor is then positioned behind each microlens to receive light propagating through the microlens for the capture of images. One or more processors operable with the display can then synthesize images from the array of image sensors, each receiving light to capture an image through a corresponding microlens, to form a composite image.

Advantageously, a "camera" facing outward from the display is formed from an array of image sensors disposed behind the substrate carrying the electroluminescent elements. Each image sensor receives light from a microlens that interspaces electroluminescent elements, but does not interrupt the pixels of the display. Advantageously, a "continuous" display can be placed along a major surface of the device without any requirement for "non-display" real estate to be allocated to a camera. As such, a truly "borderless" display can be achieved without sacrificing the ability to capture images from that side of the device. This feature can be seen by comparing FIG. 7 with FIG. 8.

Figure 7:
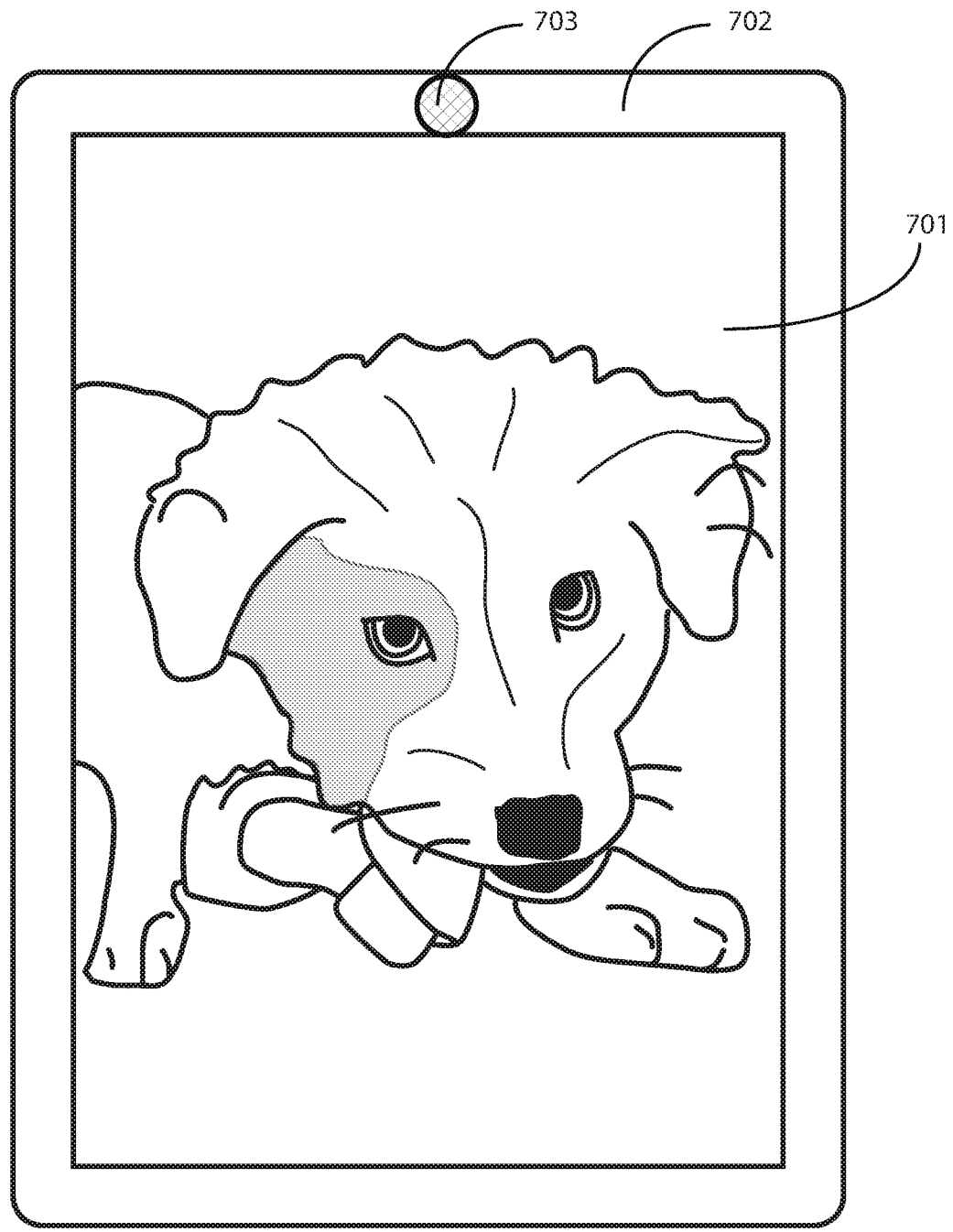
FIG. 7 illustrates a prior art electronic device in operation.

Beginning with FIG. 7, illustrated therein is a prior art electronic device 700 employing a conventional AMOLED display 701. The electronic device 700 requires "dead space" 702, i.e., space that the AMOLED display 701 cannot cover, to accommodate devices such as a front-facing camera 703. Accordingly, the housing 704 of the electronic device 700 has to be larger that the AMOLED display 701, with a dead space 702 border surrounding the AMOLED display 701.

By contrast, embodiments of the present disclosure advantageously solve this problem by placing the imager behind the display, with light propagating to the various image sensors through corresponding microlenses interspacing electroluminescent elements of each pixel structure of the display. This allows for the elimination dead space, which results in a "borderless" display design. Accordingly, borders of electronic device housings are not required because there are no dead spaces required for an imager. To the contrary, it is disposed behind the display.

Figure 8:
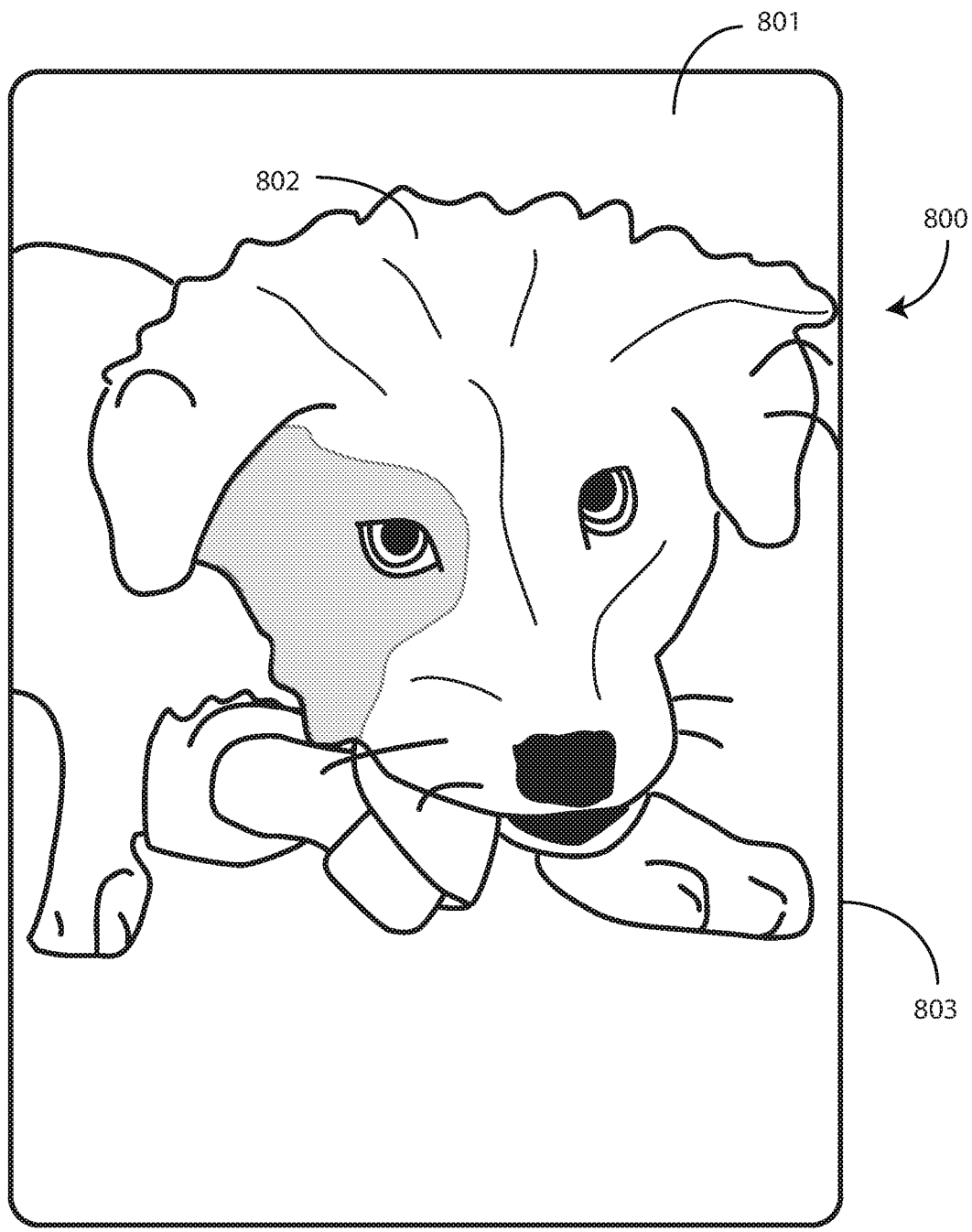
FIG. 8 illustrates one explanatory electronic device in accordance with one or more embodiments of the disclosure in operation.

This is shown in FIG. 8. Turning now to FIG. 8, illustrated therein is an electronic device 800 comprising the display 801. The display 801 could be the embodiment of FIG. 3, the embodiment of FIG. 5, or the embodiment of FIG. 6. Due to the fact that the front-facing image capture device is disposed behind the display 801, the entire front face of the electronic device 800 is available for presenting images 802 to a user. There is no need for the housing 803 of the electronic device 800 to include borders that picture frame the display 801 to accommodate a separate camera. To the contrary, the display 801 can span an entire major face of the electronic device 800 so that the entirety of the major face can be used as active display area.

Figure 9:
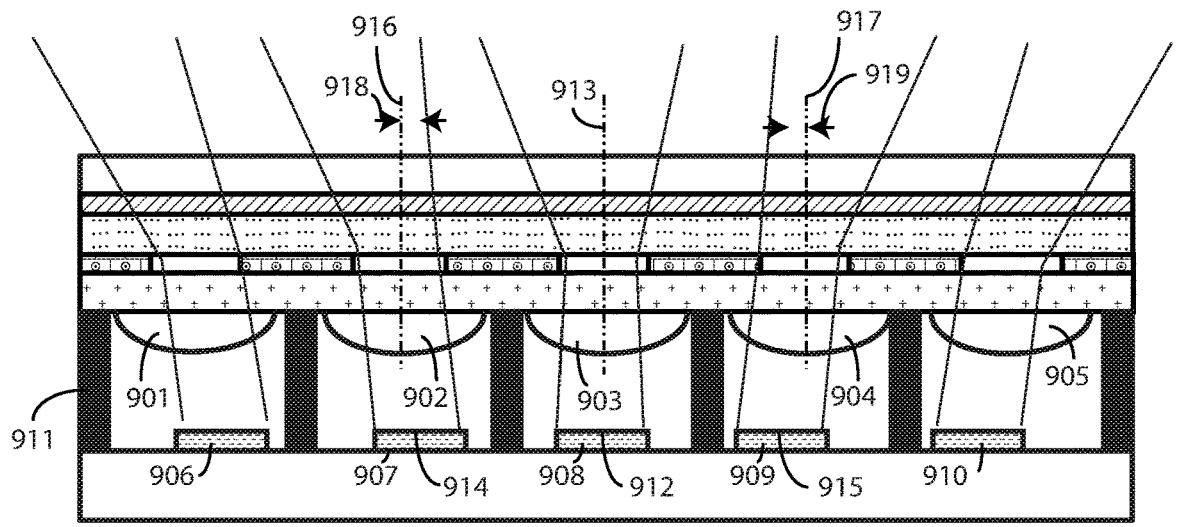
FIG. 9 illustrates one explanatory display in accordance with one or more embodiments of the disclosure with a geometric alignment between some image sensors and corresponding microlenses being different from another geometric alignment between other image sensors and corresponding microlenses.
Figure 10:
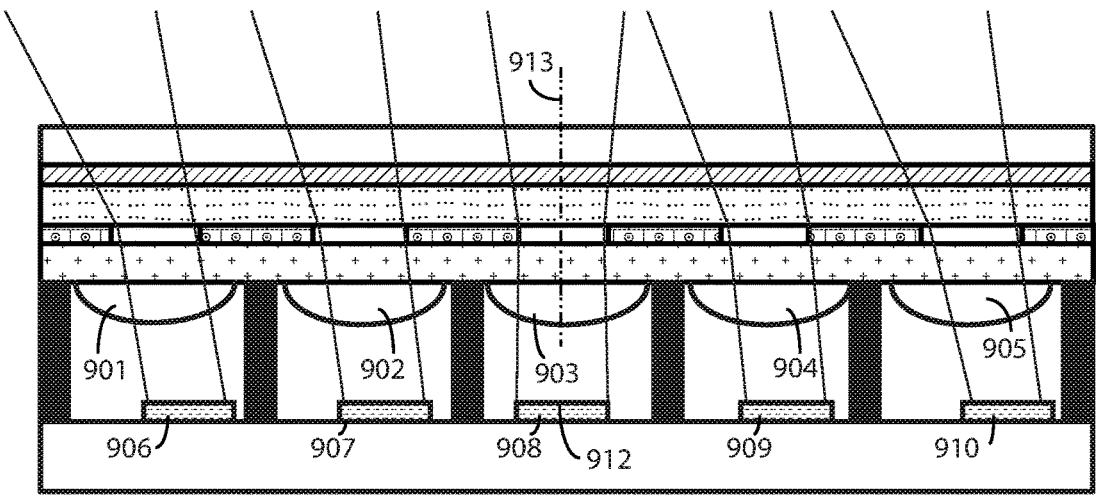
FIG. 10 illustrates another explanatory display in accordance with one or more embodiments of the disclosure with a geometric alignment between some image sensors and corresponding microlenses being different from another geometric alignment between other image sensors and corresponding microlenses.
Figure 11:
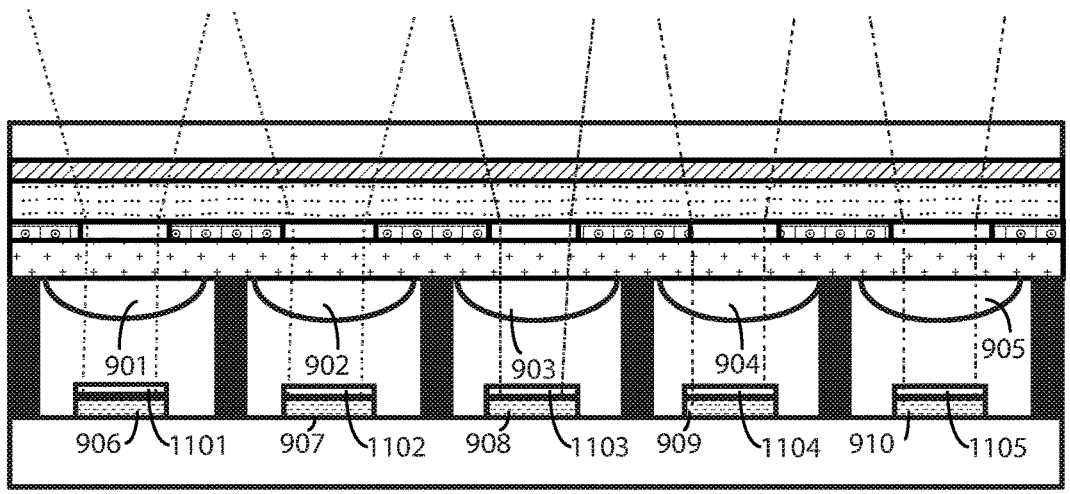
FIG. 11 illustrates yet another explanatory display in accordance with one or more embodiments of the disclosure with a geometric alignment between some image sensors and corresponding microlenses being different from another geometric alignment between other image sensors and corresponding microlenses.

Among groups of pixel structures, alignment between image sensor and its corresponding microlens can be varied to achieve interesting optical effects in the images synthesized from the images captured by groups of image sensors. FIGS. 9-11 describe a few examples of how this can occur. Others will be obvious to those of ordinary skill in the art having the benefit of this disclosure.

Beginning with FIG. 9, in one or more embodiments a geometric alignment between some image sensors and a corresponding microlens can be altered to create an optical effect in a composite image. As shown in FIG. 9, a group of five microlenses 901, 902, 903, 904, 905 and five corresponding image sensors 906, 907, 908, 909, 910 selected from a plurality of pixel structures are shown. In this illustrative embodiment, each microlens 901, 902, 903, 904, 905 corresponds to an image sensor 906, 907, 908, 909, 910 on a one to one basis, with each image sensor 906, 907, 908, 909, 910 receiving light propagating through only a single microlens 901, 902,903, 904, 905. Optical barriers 911 separate each image sensor 906, 907, 908, 909, 910 and its corresponding microlens 901, 902, 903, 904, 905 such that each image sensor 906, 907, 908, 909, 910 captures light from a single microlens 901, 902, 903, 904, 905.

As shown in FIG. 9, a geometric alignment between some image sensors of the plurality of pixel structures and a corresponding microlens is different from another geometric alignment between other image sensors of the plurality of pixel structures and the corresponding microlens. This difference is intentional, and is made to create an optical effect in the composite image synthesized from images captured by the collective group of image sensors 906, 907, 908, 909, 910. In the illustrative embodiment of FIG. 8, the optical effect is that of an expanded field of view effect.

Illustrating by example, a center 912 of image sensor 908 is aligned with the optical axis 913 of microlens 903. However, the center 914 of image sensor 907 is offset 918 from the optical axis of corresponding microlens 902 to capture different field of view. Similarly, the center 915 of image sensor 909 is offset 919 from the optical axis 917 of corresponding microlens 904. The centers of image sensors 906, 907 are even more offset from the optical axes of their corresponding microlenses 901,905 than are the centers 914, 915 of image sensors 902, 904 from the optical axes 916, 917 of their corresponding microlenses 902, 904 by shifting microlenses 902, 905 inward, i.e., toward center image sensor 908. This results in fields of view of various image sensors being non-overlapping. For instance, the field of view of image sensors 906, 907 is non-overlapping with the field of view of image sensors 909, 910.

Accordingly, as shown in FIG. 9, a center of the some image sensors, e.g., image sensors 906, 907, 909, 910, of the plurality of pixel structures is offset from an optical axis of a corresponding microlens, e.g., microlenses 901, 902, 904, 905, and the center of other image sensors, e.g., image sensor 908, of the plurality of pixel structures is aligned with the optical axis of the corresponding microlens, e.g., microlens 903.

By creating this difference in alignments among a selected group of image sensor/microlens pairs, the overall field of view of the combined camera defined by the image sensors 906, 907, 908, 909, 910 is expanded. It is well to note that while this effect is achieved in FIG. 9 by adjusting alignment between image sensor center and corresponding microlens optical axis, it can be achieved in other ways as well.

Illustrating by example, each microlens 901, 902, 904, 905 can take differing shapes in another embodiment to provide a larger field of view. Alternatively, each image sensor 906, 907, 908, 909, 910, or each microlens 901, 902, 904, 905, can be tilted. It should also be noted that any gaps in the overall field of view introduced by adjusting the alignment between image sensor center and corresponding microlens optical axis will be negligible due to the fact that the distance between each image sensor 906,907,908,909, 910 is small, e.g., on the order of 100 micrometers or so between adjacent pixel structures. Moreover t should be noted that these gaps will only occur at short distances because each image sensor has a field of view that overlaps that of its neighbor at longer distances.

Turning now to FIG. 10, illustrated therein is another adjustment of alignment between image sensor center and corresponding microlens optical axis to achieve an optical effect in a composite image formed by synthesis of the separate images of each image sensors. In the embodiment of FIG. 10, the optical effect is a three-dimensional effect.

As before, a group of five microlenses 901, 902, 903, 904, 905 and five corresponding image sensors 906, 907, 908, 909, 910 selected from a plurality of pixel structures are shown. Each microlens 901, 902, 903, 904, 905 again corresponds to an image sensor 906, 907, 908, 909, 910 on a one to one basis, with each image sensor 906, 907, 908, 909, 910 receiving light propagating through only a single microlens 901, 902, 903, 904, 905. Optical barriers 911 separate each image sensor 906, 907, 908, 909, 910 and its corresponding microlens 901, 902, 903, 904, 905 such that each image sensor 906, 907, 908, 909, 910 captures light from a single microlens 901,902,903,904,905.

As shown in FIG. 10, a geometric alignment between some image sensors of the plurality of pixel structures and a corresponding microlens is different from another geometric alignment between other image sensors of the plurality of pixel structures and the corresponding microlens. Illustrating by example, a center 912 of image sensor 908 is aligned with the optical axis 913 of microlens 903. However, the centers of the other image sensors 906, 907, 909, 910 are offset—as viewed in FIG. 10—from the optical axes of their corresponding microlenses 901, 902, 904, 905 by amounts sufficient to cause image sensors 906, 907, 909, 910 to have an identical and overlapping field of view. The imagers are arranged in pairs such that each, for example 906 is separated from another, in this example, 909 by a certain parallax distance.

Moreover, the amount that centers of the other image sensors 906, 907, 909, 910 are offset can be adjusted so that a select group of the image sensors have an identical or overlapping field of view. In this illustrative embodiment, image sensors 906, 907 have an overlapping field of view with image sensors 909, 910. This scheme allows generation of depth effects such as background subtraction and Bokeh effects. In practical implementations, some groups will be arranged to expand the field of view and some groups will be arranged to create depth effect.

These adjustments can be used to compute the distance of features in the scene from a stereo algorithm. The distance can then be used to introduce depth effects such as background subtraction and Bokeh effects, which are in focus subjects with softer, more out of focus backgrounds. While only a few image sensors 906, 907, 908, 909, 910 are shown for simplicity in FIG. 10, a larger number would be used to capture images of conventional size. When larger numbers are used, some groups of image sensors will be arranged to expand the field of view, as shown in FIG. 9 above, while others can be arranged as shown in FIG. 10 to create a depth effect, a three-dimensional effect, or both.

Turning now to FIG. 11, illustrated therein is another adjustment to achieve an optical effect in a composite image formed by synthesis of the separate images of each image sensors. In this illustrative embodiment, fields of view of the plurality of image sensors 901, 902, 903, 904, 905 are identical and overlapping. Additionally, one or more band-pass color filters 1101, 1102, 1103, 1104, 1105 filter light received by the plurality of image sensors 901, 902, 903, 904, 905.

Thus, rather than using an adjustment of alignment between image sensor center and corresponding microlens optical axis, the embodiment of FIG. 11 relies upon band pass filters 1101, 1102, 1103, 1104, 1105 to allow each image sensor to capture only a narrow spectrum of light to provide a precise measurement of the spectrum of light in the scene. Accordingly, in this illustrative embodiment, a select group of image sensors can be arranged to have identical and overlapping field of view with band-pass color filters to select a narrow spectrum of light from 400 to 1100 nm (purple to near-infrared). This scheme allows very high resolution spectral imaging for either material identification or high-accuracy automated color balancing.

As before, a group of five microlenses 901, 902, 903, 904, 905 and five corresponding image sensors 906, 907, 908, 909, 910 selected from a plurality of pixel structures are shown. Each microlens 901, 902, 903, 904, 905 again corresponds to an image sensor 906, 907, 908, 909, 910 on a one to one basis, with each image sensor 906, 907, 908, 909, 910 receiving light propagating through only a single microlens 901, 902, 903, 904, 905. Optical barriers 911 separate each image sensor 906, 907, 908, 909, 910 and its corresponding microlens 901, 902, 903, 904, 905 such that each image sensor 906, 907, 908, 909, 910 captures light from a single microlens 901, 902, 903, 904, 905.

In FIG. 11, each image sensor 906, 907, 908, 909, 910 is aligned with the optical axis of its corresponding microlens 901, 902, 903, 904, 905 such that each image sensor 906, 907, 908, 909, 910 has an identical and overlapping field of view. One or more band pass filters 1101, which can be implemented by the one or more processors (201) operable with each image sensor 906, 907, 908, 909, 910, can then be used to filter images from each image sensor 906, 907, 908, 909, 910 along a narrow spectrum of light, within the range of 400 and 1100 nanometers, i.e., purple to near-infrared. A typical bandwidth is 10-100 nanometers for each imager. Where such band pass filters 1101 are applied, the synthesized photograph from the image sensors 906, 907, 908, 909, 910 allows for very high-resolution spectral imaging. Such spectral imaging can be used for a variety of purposes, including material identification and high-accuracy automated color balancing. Other applications will be obvious to those of ordinary skill in the art having the benefit of this disclosure.

It should be noted that the examples of optical effects shown in FIGS. 9-11 are illustrative only, as numerous others will be obvious to those of ordinary skill in the art having the benefit of this disclosure. Illustrating by example, in another embodiment a selected group of image sensors can be arranged relative to their corresponding microlenses to focus on a central area near a person's face with high resolution to provide iris identification and face recognition capability. Such a group of image sensors can operate, with the assistance of either hardware or filters, either in visible or near-infrared spectrum. Some of these image sensors can operate at different wavelengths capture different facial and iris features as well.

Illustrating by example, in one or more embodiments the plurality of image sensors are arranged to focus on a central focal point. Then, one or more processors are operable to perform one of an iris identification or a facial recognition from images synthesized at the central focal point. Said differently, a select group of image sensors can be arranged to focus on a central area near a person's face with high resolution to provide iris identification and face recognition capability. This group of image sensors can operate either in visible or near-infrared spectrum. Some of these image sensors can operate at different wavelengths capture different facial and iris features.

In yet another embodiment, a selected group of image sensors can comprise low-power single or multiple segment sensors, or alternatively complementary metal-oxide semiconductor (CMOS) sensors with a low-power mode. Such sensors can be continually ON so as to detect motion or other environmental changes. This group of image sensors can operate either in visible or near-infrared spectrum. Some of these image sensors can operate at different wavelengths capture different facial and iris features. As noted, these examples are illustrative only. Numerous others will be obvious to those of ordinary skill in the art having the benefit of this disclosure.

In some embodiments, image sensors and corresponding microlenses of all pixel structures can be used to create a composite image. Said differently, in some embodiments one or more processors can synthesize images from all image sensors of all pixel structures to form a composite image. However, embodiments of the disclosure contemplate that high quality and even high definition (HD) images can be created with far fewer pixel structures.

Figure 12:
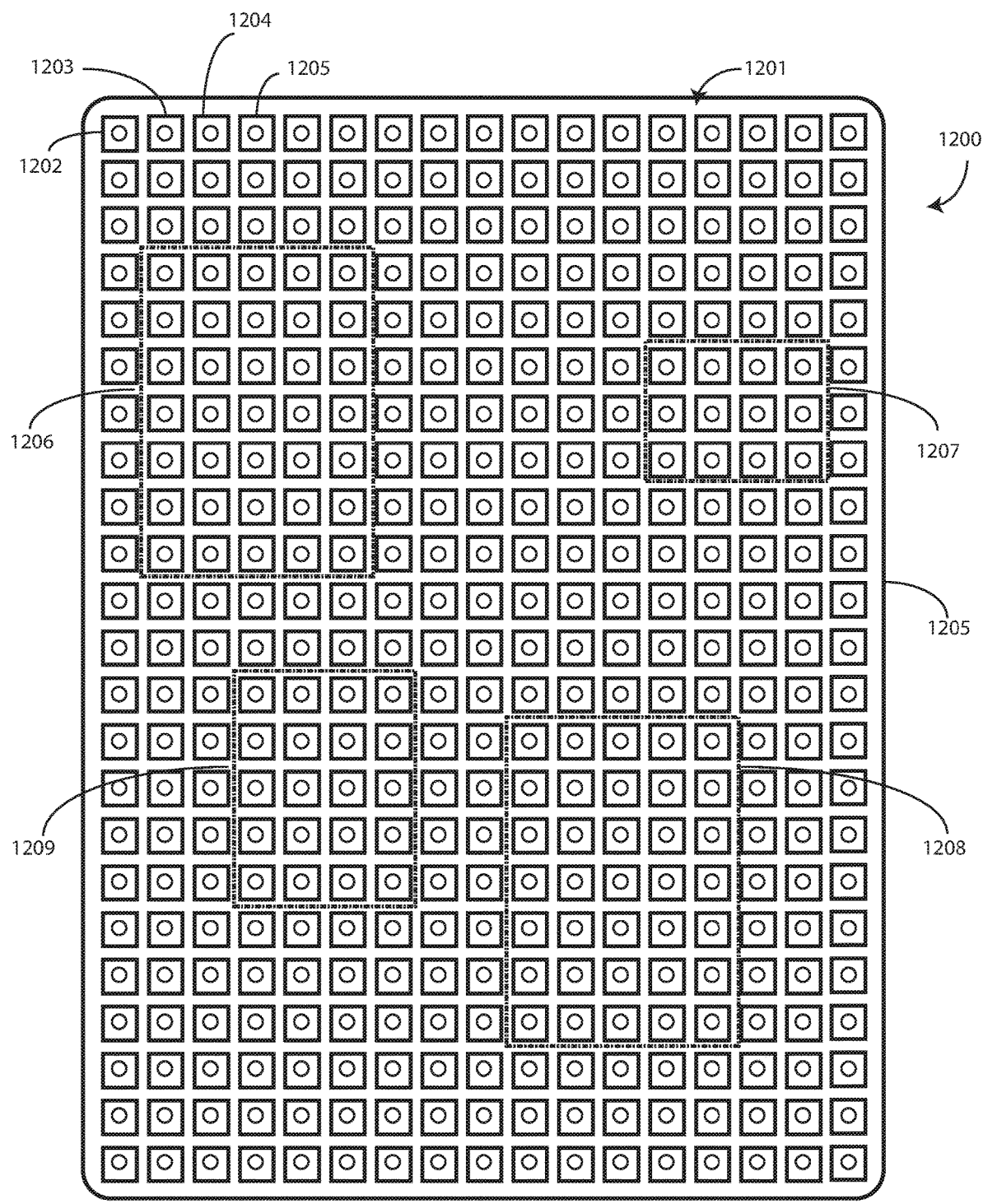
FIG. 12 illustrates another explanatory display in accordance with one or more embodiments of the disclosure.

Illustrating by example, an image sensor with a diameter of only 60 micrometers can still capture 10,000 pixels worth of information. Accordingly, images from 100 microlens/image sensor pairs can easily be synthesized to yield an image of one or two million pixels. With this in mind, embodiments of the disclosure contemplate than multiple different "virtual cameras" can be created behind a single display. Turning now to FIG. 12, illustrated therein is one such embodiment.

A display 1200 comprises an array 1201 of pixel structures 1202,1203,1204. Each comprises a plurality of electroluminescent elements as previously described. The array 1201 of pixel structures 1202,1203,1204 is disposed on a substrate 1205. In one or more embodiments, each pixel structure of the array 1201 of pixel structures 1202,1203, 1204 comprises a single microlens interspacing the plurality of electroluminescent elements. In one or more embodiments, each pixel structure of the array 1201 of pixel structures 1202,1203,1204 comprises a single image sensor.

Four groups 1206,1207,1208,1209, i.e., four "pluralities," of pixel structures 1202,1203,1204 have been selected to work in tandem to yield composite images. Pixel structures in each group 1206,1207,1208,1209 each comprise a microlens interspacing one or more electroluminescent elements each pixel structure of the plurality of pixel structures and an image sensor receiving light propagating through the microlens. For instance, in a first group 1206 of pixel structures each pixel structure comprises the microlens and the image sensor, while in groups 1207,1208,1209 each pixel structure also comprises the microlens and the image sensor. In this illustrative embodiment, pixel structures in each group 1206, 1207,1208,1209 are contiguous.

One or more processors (201) are operable with the display 1200. As before, the one or more processors (201) are operable to synthesize images from any given plurality of image sensors in the array 1201 of pixel structures 1202,1203,1204 to form a composite image.

Since groups 1206,1207,1208,1209 are defined, each can function as its own virtual camera. Group 1206 may function as a wide-angle camera, while group 1207 functions as a depth of field camera. Other cameras can be included beyond the four groups 1206,1207,1208,1209 shown.

Accordingly, in one or more embodiments the one or more processors (201) can synthesize images from image sensors in each group 1206,1207,1208,1209 separately to form different types of composite images. For instance, the one or more processors (201) can synthesize images from image sensors in the first group 1206 of the array 1201 of pixel structures 1202,1203,1204 to form a first composite image, while synthesizing other images from image sensors of the other groups 1207,1208,1209 to form one or more other composite images, and so forth.

Figure 13:
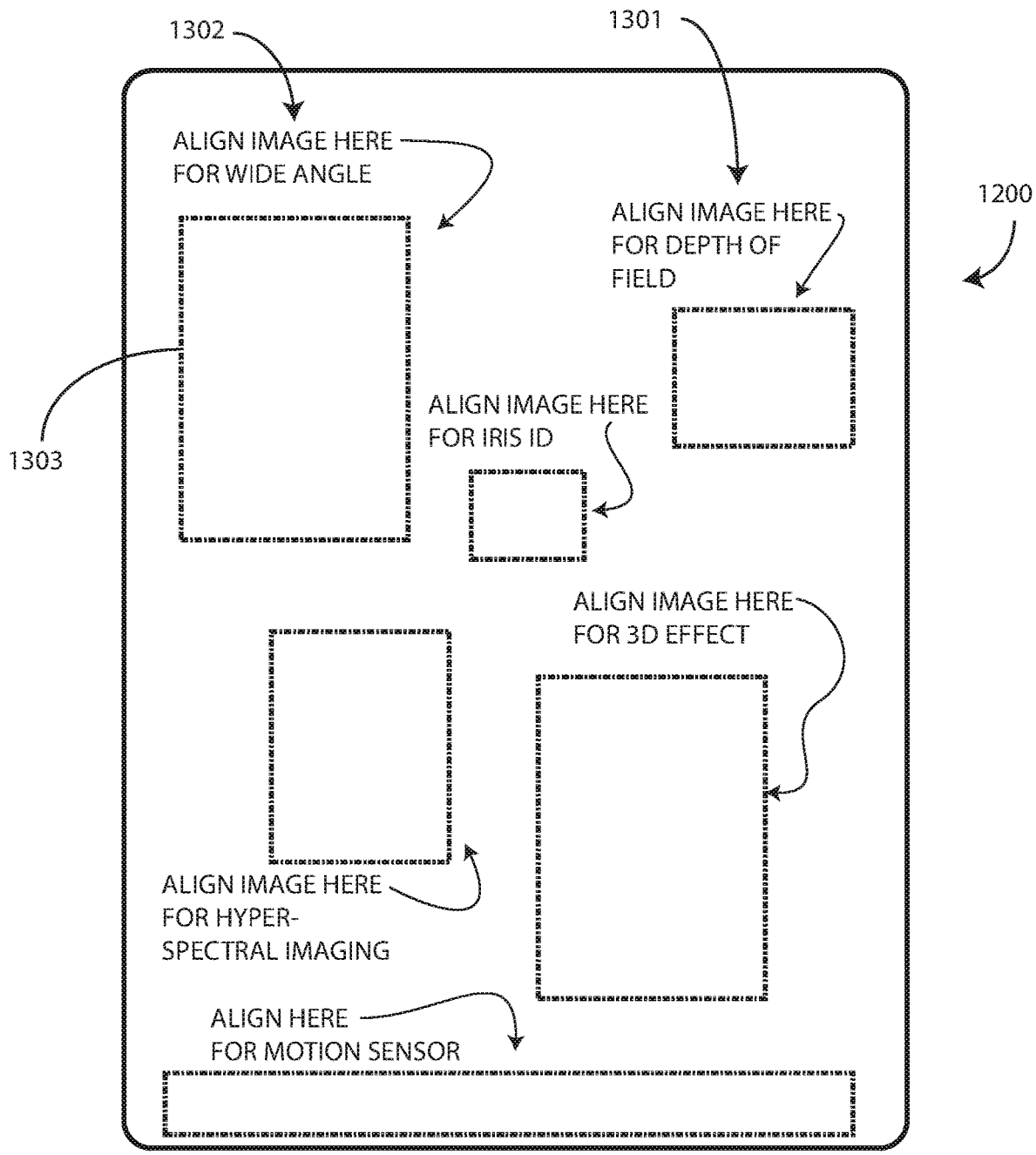
FIG. 13 illustrates another explanatory display in accordance with one or more embodiments of the disclosure.

Embodiments of the disclosure contemplate that since these groups 1206,1207,1208,1209 of image sensors are disposed behind the display 1200, it can be difficult for a user to know how to align the subject of an image with a predefined virtual camera. Turning now to FIG. 13, illustrated therein is a solution to this issue.

As shown in FIG. 13, the one or more processors (201) present indicia 1301 on the display 1200 distinguishing, for example, the first group (1206) of pixel structures from the other groups 1207,1208,1209 of pixel structures. In this illustrative embodiment, the indicia 1301 comprise an identifier 1302 of the virtual camera type and an outline 1303 identifying a location of each group of pixel structures. Accordingly, a user may simply align the subject of an image within the outline 1303 of the desired virtual camera and capture the shot.

Figure 14:
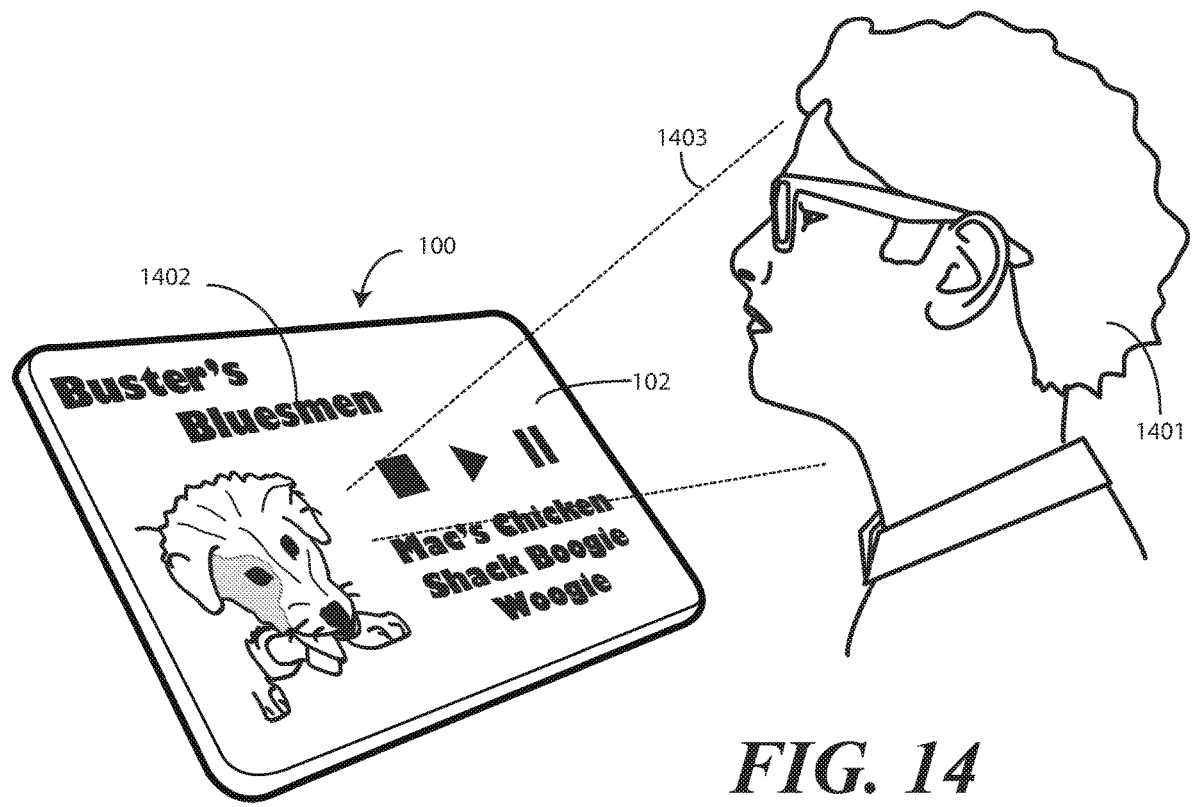
FIG. 14 illustrates one explanatory electronic device in accordance with embodiments of the disclosure in use.

Embodiments of the disclosure contemplate that images can be captured even while a display is presenting other information. Turning now to FIG. 14, illustrated therein is a user 1401 using an electronic device 100 configured in accordance with one or more embodiments of the disclosure. Here, the electronic device 100 is functioning in a music player mode. One or more processors (201) of the electronic device are presenting content 1402 on the display 102. In this illustrative example, the user 1401 is jamming to the sweet sounds of Buster and his Bluesmen playing the Chicken Shack Boogie Woogie. Accordingly, the content 1402 on the display 102 identify this quintessential standard of musical enjoyment.

At the same time, the user 1401 desires to capture a photograph of his face to capture the sheer joy he experiences listening to a bass riff played by Henry Burns. Since light reflecting from his face can propagate through the microlenses of the various pixel structures of the display 102, the one or more processors (201) synthesize images from a plurality of image sensors of the one or more pixel structures to form a composite image 1403. This is all done without interrupting the content 1402 being presented on the display.

Figure 15:
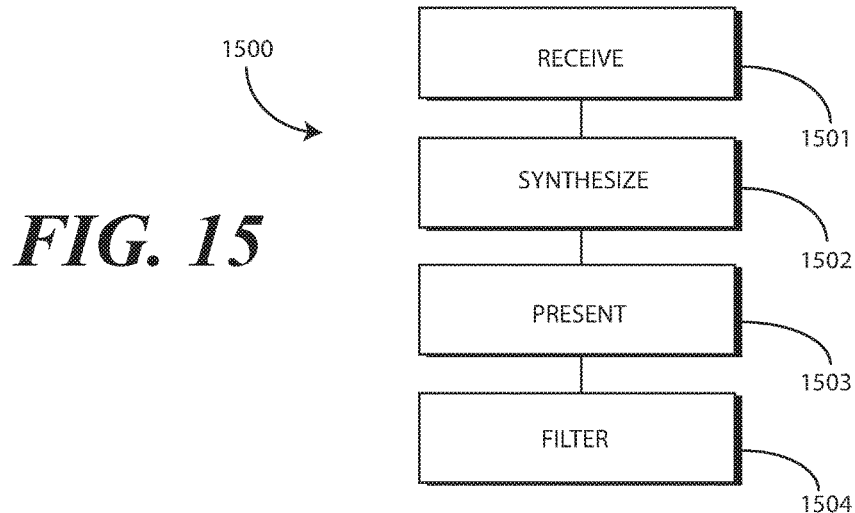
FIG. 15 illustrates one explanatory method in accordance with one or more embodiments of the disclosure.

Turning now to FIG. 15, illustrated therein is an explanatory method 1500 configured in accordance with one or more embodiments of the disclosure. At step 1501, a display comprises a plurality of pixel structures arranged on a substrate. One or more pixel structures of the plurality of pixel structures each comprise a microlens interspacing a plurality of electroluminescent elements of each pixel structure of the one or more pixel structures and an image sensor receiving light propagating through the microlens. At step 1501, one or more processors operable with the display receive a plurality of images from a plurality of image sensors receiving light from a plurality of microlenses interspacing electroluminescent structures of a plurality of pixel structures of a display. In one embodiment, image sensor of step 1501 receives light from a single microlens.

At step 1502, the one or more processors synthesize the plurality of images to form a composite image. In one or more embodiments, the one or more pixel structures of step 1501 comprises at least a first pixel structure and a second pixel structure. Accordingly, in one embodiment step 1502 comprises synthesizing at least a first set of images from a first plurality of image sensors of a first set of pixel structures to form a first composite image and a second set of images from a second plurality of image sensors of a second set of pixel structures to form a second composite image.

Where the latter is true, i.e., where the one or more pixel structures of step 1501 comprises at least a first pixel structure and a second pixel structure, optional step 1503 can be employed. This step 1503 comprises presenting indicia along the display identifying the plurality of pixel structures. At step 1504, optional band pass or other types of filtering can be applied to achieve various optical effects, including those described above with reference to FIGS. 9-11.

Figure 16:
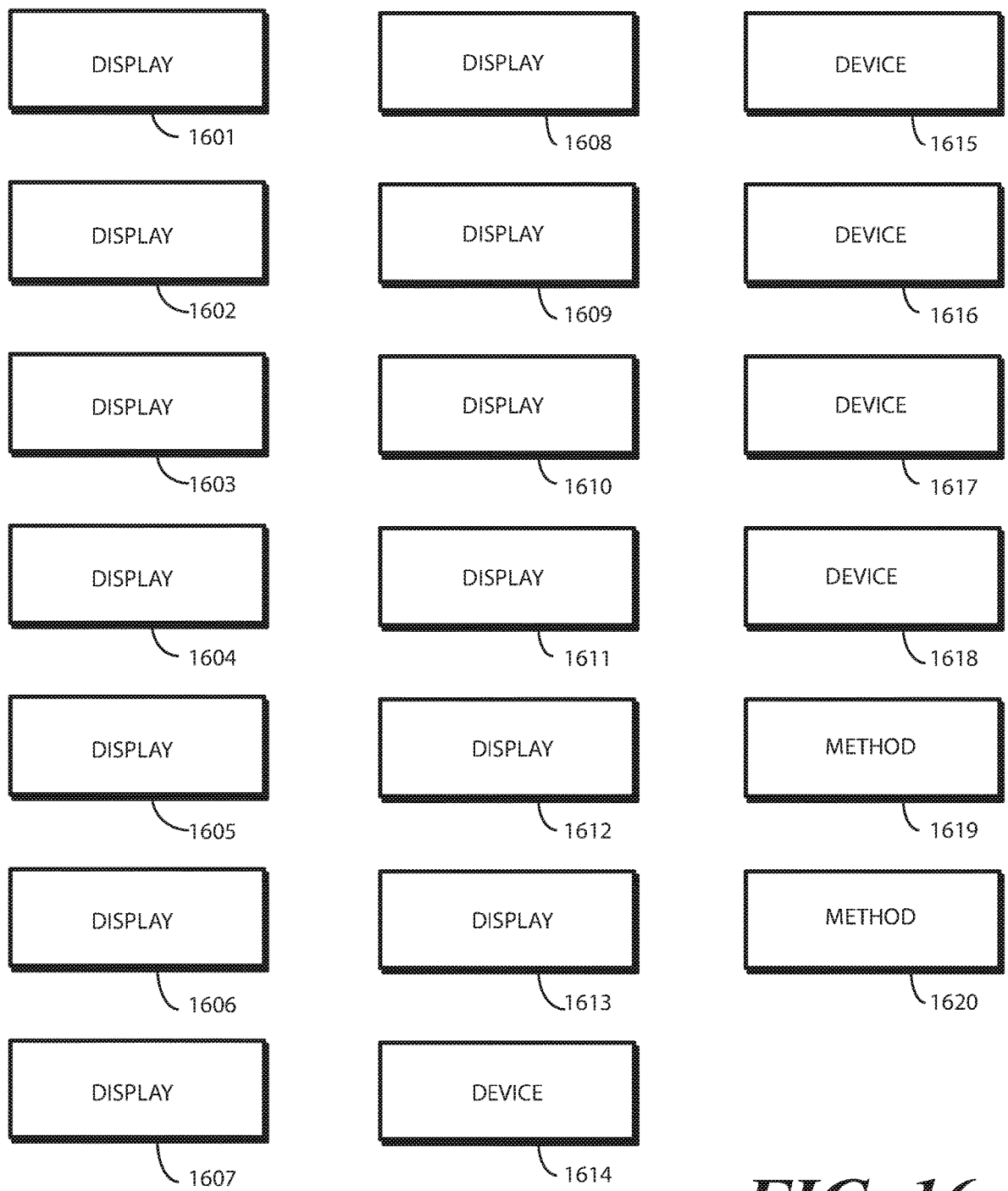
FIG. 16 illustrates various embodiments of the disclosure.

Turning now to FIG. 16, illustrated therein are various embodiments of the disclosure. At 1501 a display comprises an array of pixel structures each comprising a plurality of electroluminescent elements, the array of pixel structures arranged on a first substrate. At 1501, a plurality of pixel structures selected from the array of pixel structures each comprise a microlens interspacing one or more electroluminescent elements each pixel structure of the plurality of pixel structures. At 1501, a plurality of pixel structures selected from the array of pixel structures each comprise an image sensor receiving light propagating through the microlens.

At 1502, one or more processors operable are with the display of 1501. At 1502 the one or more processors synthesize images from a plurality of image sensors of the plurality of pixel structures to form a composite image.

At 1503, a geometric alignment between some image sensors of the plurality of pixel structures and a corresponding microlens is different from another geometric alignment between other image sensors of the plurality of pixel structures and the corresponding microlens to create an optical effect in the composite image of 1502.

At 1504, the optical effect comprises an expanded field of view effect, wherein fields of view of the plurality of image sensors of 1501 are non-overlapping. At 1505, the optical effect comprises a three-dimensional effect, wherein the some image sensors have an overlapping field of view. At 1506, the optical effect comprises a hyper-spectral imaging effect, wherein fields of view of the plurality of image sensors are identical and overlapping, further comprising one or more band-pass color filters to filter light received by the plurality of image sensors.

At 1507, a center of the some image sensors of 1501 is offset from an optical axis of a corresponding microlens, and the center of other image sensors of the plurality of pixel structures is aligned with the optical axis of the corresponding microlens.

At 1508, the display of 1501 further comprises one or more processors operable with the display. At 1508, the array of pixel structures of 1501 comprises a first plurality of pixel structures with each pixel structure of the first plurality of pixel structures comprising the microlens and the image sensor and one or more second pluralities of pixel structures with each pixel structure of the one or more second pluralities of pixel structures comprising the microlens and the image sensor. At 1508, the one or more processors synthesize images from a first plurality of image sensors of the plurality of pixel structures to form a first composite image and other images from image sensors of the one or more second pluralities of pixel structures to form one or more second composite images.

At 1509, the one or more processors of 1501 further present indicia on the display distinguishing the first plurality of pixel structures from the one or more second pluralities of pixel structures.

At 1510, a diameter of the microlens of 1501 is less than half another diameter of the each pixel structure. At 1511, image sensors of adjacent pixel structures of 1501 are separated by an optical barrier such that each image sensor captures light from a single microlens. At 1512, the image sensor of 1501 is disposed on a second substrate oriented substantially parallel with the first substrate.

At 1513, a device comprises a display comprising a plurality of pixel structures arranged on a substrate. At 1513, one or more pixel structures of the plurality of pixel structures each comprise a microlens interspacing a plurality of electroluminescent elements of each pixel structure of the one or more pixel structures and an image sensor receiving light propagating through the microlens. At 1513, one or more processors, operable with the display, synthesize images from a plurality of image sensors of the one or more pixel structures to form a composite image.

At 1514, each pixel structure of the one or more pixel structures of 1514 comprises a single microlens interspacing the plurality of electroluminescent elements of the each pixel structure of the one or more pixel structures. At 1515, some image sensors of the plurality of image sensors of 1513 are arranged to focus on a central focal point, wherein the one or more processors are operable to perform one of an iris identification or a facial recognition from images synthesized at the central focal point.

At 1516, the device of 1513 further comprises a motion detector operable with the plurality of image sensors. At 1516, the plurality of image sensors are actuated when the motion sensor detects motion. At 1517, the one or more pixel structures of 1513 comprise at least a first pixel structure and a second pixel structure, wherein a center of a first image sensor of the at least the first pixel structure is offset from an axis of a first microlens of the at least the first pixel structure more than another center of a second image sensor of the at least the second pixel structure is offset from another axis of a second microlens of the at least the second pixel structure.

At 1518, the one or more processors of 1514 synthesize a first set of images from a first plurality of image sensors of a first set of pixel structures to form a first composite image and a second set of images from a second plurality of image sensors of a second set of pixel structures to form a second composite image.

At 1519, a method comprises receiving a plurality of images from a plurality of image sensors receiving light from a plurality of microlenses interspacing electroluminescent structures of a plurality of pixel structures of a display, with each image sensor receiving light from a single microlens. At 1519, the method includes synthesizing the plurality of images to form a composite image. At 1520, the method of 1519 further comprises presenting indicia along the display identifying the plurality of pixel structures.

In the foregoing specification, specific embodiments of the present disclosure have been described. However, one of ordinary skill in the art appreciates that various modifications and changes can be made without departing from the scope of the present disclosure as set forth in the claims below. Thus, while preferred embodiments of the disclosure have been illustrated and described, it is clear that the disclosure is not so limited. Numerous modifications, changes, variations, substitutions, and equivalents will occur to those skilled in the art without departing from the spirit and scope of the present disclosure as defined by the following claims. For example, while a geometric alignment between some image sensors and a corresponding microlens was be altered with reference to FIGS. 9-11 above to create an optical effect in a composite image, this can be done for other reasons as well. If, for example, a set of image sensors is disposed near the edge of a glass fascia defining a major face of the display, this geometric alignment can be used so that those image sensors can see a different field of view, such as through the edge of the cover layer.

Accordingly, the specification and figures are to be regarded in an illustrative rather than a restrictive sense, and all such modifications are intended to be included within the scope of present disclosure. The benefits, advantages, solutions to problems, and any element(s) that may cause any benefit, advantage, or solution to occur or become more pronounced are not to be construed as a critical, required, or essential features or elements of any or all the claims.

What is claimed is:

1. A display, comprising:
    an array of pixel structures each comprising a plurality of electroluminescent elements, the array of pixel structures arranged on a first substrate;
    wherein a plurality of pixel structures selected from the array of pixel structures each comprise a microlens interspacing one or more electroluminescent elements each pixel structure of the plurality of pixel structures.

2. The display of claim 1, wherein the microlens comprises a single microlens.

3. The display of claim 1, wherein the microlens comprises multiple microlenses.

4. The display of claim 3, wherein the multiple microlenses are arranged in multiple groups.

5. The display of claim 1, wherein the plurality of pixel structures each further comprises an image sensor positioned behind the microlens.

6. The display of claim 5, the image sensor receiving light propagating through the microlens.

7. The display of claim 6, further comprising one or more processors operable with the display, the one or more processors synthesizing images from a plurality of image sensors of the plurality of pixel structures to form a composite image.

8. The display of claim 7, the microlens causing an expanded field of view effect in the composite image.

9. The display of claim 7, the microlens causing an overlapping field of view effect in the composite image.

10. The display of claim 5, wherein a geometric alignment between some image sensors of the plurality of pixel structures and a corresponding microlens is different from another geometric alignment between other image sensors of the plurality of pixel structures.

11. The display of claim 5, wherein a center of the some image sensors of the plurality of pixel structures is offset from an optical axis of a corresponding microlens, and a center of other image sensors of the plurality of pixel structures is aligned with the optical axis of the corresponding microlens.

12. The display of claim 5, further comprising a second substrate, wherein the microlens is coupled to the first substrate and the image sensor is coupled to the second substrate.

13. The display of claim 12, wherein the plurality of pixel structures is coupled to a first major face of the first substrate and the microlens is coupled to a second major face of the first substrate.

14. The display of claim 12, further comprising an optical barrier array positioned between the first substrate and the second substrate.

15. A device, comprising:
a display comprising a plurality of pixel structures arranged on a substrate;
wherein one or more pixel structures of the plurality of pixel structures each comprise a microlens interspacing a plurality of electroluminescent elements of each pixel structure of the one or more pixel structures.

16. The device of claim 15, wherein the each pixel structure of the one or more pixel structures comprises a single microlens interspacing the plurality of electroluminescent elements of the each pixel structure of the one or more pixel structures.

17. The device of claim 15, further comprising one or more processors operable with the display.

18. The device of claim 17, the one or more pixel structures each further comprising an image sensor, operable with the display and receiving light propagating through the microlens.

19. A method, comprising capturing one or more images from a one or more image sensors receiving light from one or more microlenses interspacing one or more electroluminescent structures of a one or more pixel structures of a display.

20. The method of claim 19, wherein the one or more images comprise two or more images, further comprising synthesizing the two or more images to form a composite image.

* * * * *